United States Patent
Jung et al.

(10) Patent No.: US 10,886,466 B2
(45) Date of Patent: Jan. 5, 2021

(54) VARIABLE RESISTOR, NON-VOLATILE MEMORY ELEMENT USING THE SAME, AND METHOD OF FABRICATING THE SAME

(71) Applicant: HANKUK UNIVERSITY OF FOREIGN STUDIES RESEARCH BUSINESS FOUNDATION, Gyeonggi-do (KR)

(72) Inventors: Chang-Uk Jung, Gyeonggi-do (KR); Susant Kumar Acharya, Gyeonggi-do (KR); Venkata Raveendra Nallagatla, Gyeonggi-do (KR); Bo Wha Lee, Gyeonggi-do (KR); Chunli Liu, Gyeonggi-do (KR)

(73) Assignee: HANKUK UNIVERSITY OF FOREIGN STUDIES RESEARCH BUSINESS FOUNDATION, Gyeonggi-do (KR)

( * ) Notice: Subject to any disclaimer, the term of this patent is extended or adjusted under 35 U.S.C. 154(b) by 195 days.

(21) Appl. No.: 15/899,526

(22) Filed: Feb. 20, 2018

(65) Prior Publication Data
US 2019/0259945 A1 Aug. 22, 2019

(51) Int. Cl.
*H01L 45/00* (2006.01)
*H01L 27/24* (2006.01)
*G11C 13/00* (2006.01)

(52) U.S. Cl.
CPC ........ *H01L 45/147* (2013.01); *G11C 13/0011* (2013.01); *H01L 27/2463* (2013.01); *H01L 45/08* (2013.01); *H01L 45/1233* (2013.01); *H01L 45/1266* (2013.01); *H01L 45/16* (2013.01); *H01L 45/1608* (2013.01); *G11C 13/004* (2013.01); *G11C 13/0069* (2013.01)

(58) Field of Classification Search
CPC ... H01L 45/147; H01L 45/08; H01L 45/1233; H01L 45/1608; H01L 27/2463; H01L 45/1266; H01L 43/10; G11C 13/004; G11B 5/1274; B01J 23/75; B01J 20/04; C01G 51/66
USPC .......... 257/43; 360/244, 324; 502/303, 328; 338/20
See application file for complete search history.

(56) References Cited

U.S. PATENT DOCUMENTS

| | | | |
|---|---|---|---|
| 2009/0231906 A1* | 9/2009 | Rinerson | H01L 45/146 365/151 |
| 2013/0216800 A1* | 8/2013 | Brock | C04B 35/016 428/213 |
| 2015/0148218 A1* | 5/2015 | Lee | B01J 20/04 502/303 |
| 2017/0170395 A1* | 6/2017 | Jung | H01L 29/02 |
| 2017/0373173 A1* | 12/2017 | Ohta | H01L 29/66 |

* cited by examiner

*Primary Examiner* — Mouloucoulaye Inoussa

(57) ABSTRACT

The present invention relates to a variable resistor comprises a first electrode, a second electrode, and a resistive switching layer disposed between the first electrode and the second electrode, wherein the resistive switching layer has a Brown-Millerite structure crystallized in an inclined orientation across the first electrode and the second electrode as an initial structure.

20 Claims, 12 Drawing Sheets

VARIABLE RESISTOR, NON-VOLATILE MEMORY ELEMENT USING THE SAME, AND METHOD OF FABRICATING THE SAME

BACKGROUND OF THE INVENTION

Field of the Invention

The present invention relates to semiconductor technology, and more particularly, to a variable resistor, a nonvolatile memory element using the variable resistor, and a method of manufacturing the same.

Description of the Related Art

In recent years, the nonvolatile memory market is rapidly expanding as demand for portable digital application devices such as digital cameras, tablet computers, and smart phone is increasing tremendously. A NAND flash memory element, which is a typical programmable non-volatile memory element, is improving storage capacity through multi-level implementation and/or three-dimensional cell structure, but there are many difficulties in accompanying processes and the fundamental limitation of flash memory elements with long drive times due to the block access architecture. Therefore, the need for new memory elements has been suggested strongly and eagerly.

There is a resistive memory element ReRAM using a variable resistor capable of reversibly changing a resistance value as a nonvolatile memory element that may replace a NAND flash memory element. The resistive memory element may utilize the physical characteristics itself of the low resistance state (LRS) and the high resistance state (HRS), which can be reversibly switched, as data states. Thus, fast switching of less than 10 ns and driving at a low power of about 1 pJ/operation may be performed. Further, it is very advantageous in terms of scaling since the cell configuration is simple and has a merit that even a multi-bit operation may be implemented in recent years. However, despite these advantages, the resistive memory element has fundamental problems to overcome for their practical use. Typically, the resistive memory element requires an electroforming process to induce a soft insulation breakdown on the initial insulating thin film in the initialization process for forming a filamentary conducting path (hereinafter, referred to as conductive filament). The electrical forming process typically requires a high voltage (VF), which requires a complex circuit design and generates a permanent property change in the variable resistor of the non-volatile memory cell during the electrical foaming process. The dispersion of switching parameters such as a set voltage, a reset voltage, resistance values of HRS and LRS, or durability may be introduced for each memory cell and/or for each memory element.

The dispersion of the switching parameters is due to uneven and uncontrollable formation and breakdown of the conductive filament resulting from the electrical foaming process. Recently, a research has been proposed that metal nano-dots, metal ion implants, or oxygen scavenger layers have been inserted into a variable resistor or between variable resistors and electrodes in order to suppress the distribution of conductive filaments and thus the dispersion of switching parameters. However, this approach adds additional non-uniformity and/or local preferential sites for the formation of conductive filaments, thus requiring an ex-situ process, and additional problems such as process difficulties and contamination may arise.

SUMMARY OF THE INVENTION

The object of the present invention is to provide a reliable variable resistor which ensures uniform memory characteristics and performs low power driving by reducing the dispersion of the switching parameters while ensuring that the voltage required for the electrical foaming of the variable resistor decreases or becomes 0 through a simple process.

Further, it is another object of the present invention to provide a method of manufacturing a variable resistor having the above-described advantages.

Further, it is another object of the present invention to provide a nonvolatile memory element using the variable resistor having the above-described advantages.

According to an aspect of the present invention in order to solve the above-mentioned problems, there is provided a variable resistor comprising: a first electrode; a second electrode; and a resistive switching layer disposed between the first electrode and the second electrode, and wherein the resistive switching layer includes a Brown-Millerite structure having a crystal plane oriented in an inclined orientation across the first electrode and the second electrode as an initial structure.

The crystal plane may be preferentially oriented in the direction of the Miller index 111. The Brown-Millerite structure may include at least two adjacent octahedron slab layers that are in contact with the first electrode and the second electrode and intersects them.

In connection with the resistive switching layer, a reversible conductive path may be formed through a topotactic phase transition in at least a portion of a perovskite crystal structure by application of an external power signal flowing through the first and second electrodes. The resistive switching layer may comprise $(Ba, Sr, Ca)_2(Fe, Co)_2O_5$, $Ca_2Al_2O_5$, or $Ca_2SiO_4$.

In one embodiment, the thickness of the resistive switching layer may be in the range of 20 nm to 500 nm. In one embodiment, any one of the first electrode and the second electrode may include a conductive metal oxide for supplying oxygen ions to the variable resistance layer. In one embodiment, the conductive metal oxide may have a perovskite crystal structure. In addition, the conductive metal oxide may be a crystalloid preferentially oriented in the Miller index 111 direction. In one embodiment, either the first electrode or the second electrode may comprise an epitaxial base layer of a perovskite crystal structure.

In order to solve another technological problem, a method of fabricating a variable resistance layer according to an embodiment of the present invention may comprise the steps for: forming a first electrode; forming a resistive switching layer having a Brown-Millerite structure crystallized in an inclined orientation as an initial on the first electrode; and forming a second electrode on the resistive switching layer.

In one embodiment, prior to the step of forming the first electrode, a step of forming a non-conductive epitaxial base layer of a perovskite crystal structure may further be performed. The perovskite crystal structure may be preferentially oriented in the Miller index 111 direction. In addition, the resistive switching layer may be crystallized in situ.

In order to solve another technological problem, a nonvolatile memory element according to an embodiment of the present invention may comprise a first conductive line, a second conductive line, and a non-volatile memory element including an array of a memory cell between the first conductive line and the second conductive line. In one embodiment, the memory cell may further comprises: a first electrode coupled to the first conductive line; a second electrode coupled to the second conductive line; and a resistive switching layer disposed between the first electrode and the second electrode and having a Brown-Millerite structure crystallized in an inclined orientation across the first electrode and the second electrode as an initial structure.

In one embodiment, the nonvolatile memory element is configured to select the first conductive line and the second conductive line, and apply the electrical forming signal flowing through the first and second electrodes. Therefore, it is possible to form a reversible conductive path through a topotactic phase transition from at least part of the Brown-Millerite structure to the perovskite crystal structure.

According to an embodiment of the present invention, if a resistive switching layer having a Brown-Millerite structure crystallized in an inclined orientation across the first and second electrodes is used, the electrical forming voltage becomes lower than or equal to the set voltage and thus, a small variable resistor may be applied.

Further, according to the embodiment of the present invention, when the variable resistor having the above-described advantages is used as a memory cell, the electrical power required for electrical forming is reduced, and accordingly, the degree of dispersion of the switching parameters is reduced. Therefore, a reliable nonvolatile memory element capable of low-power driving may be provided.

Further, according to the embodiment of the present invention, it is possible to provide a method of manufacturing a variable resistor which can easily and economically manufacture the variable resistor having the above-described advantages.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1A:
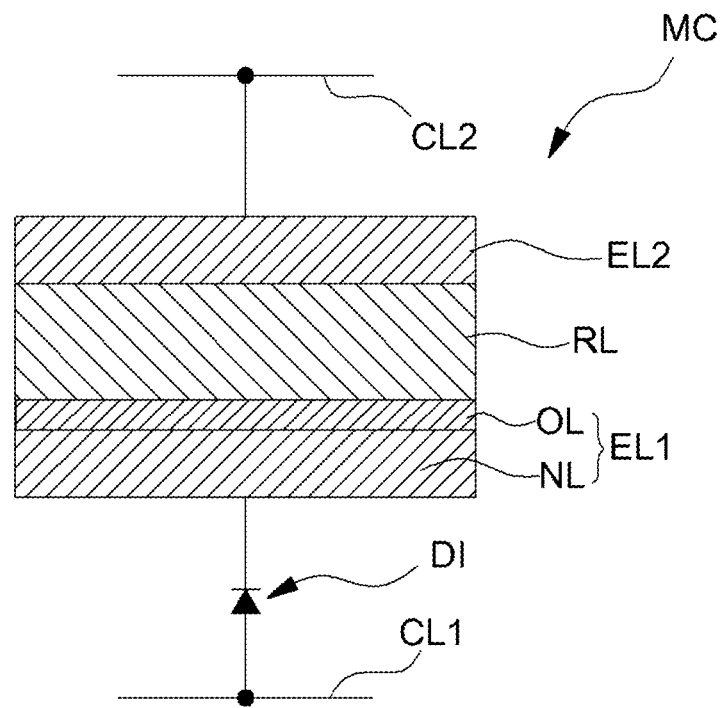
FIG. 1A shows a cross-sectional view illustrating a non-volatile memory cell according to one embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 1B:
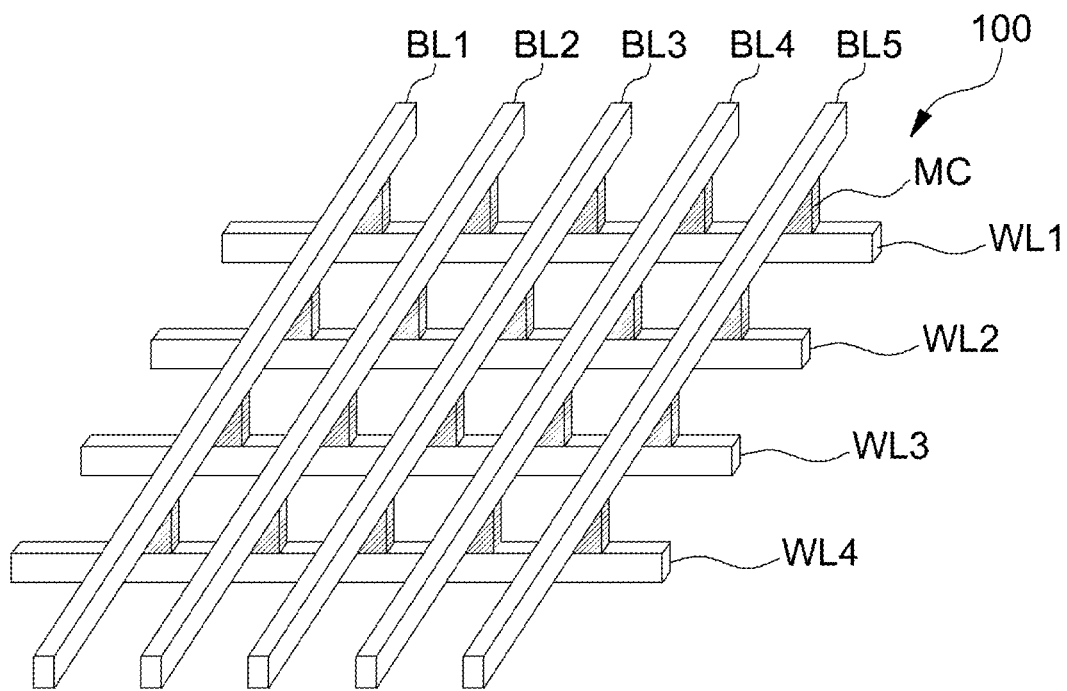
FIG. 1B is a perspective view of a non-volatile memory element in a cross-point array including non-volatile memory cells.

FIG. 1A is a cross-sectional view illustrating a nonvolatile memory cell MC according to one embodiment of the present invention, and FIG. 1B is a perspective view of a nonvolatile memory element 200 of a cross-point array including nonvolatile memory cells MC.

Referring to FIG. 1A, a nonvolatile memory cell MC includes a first electrode EL1, a second electrode EL2, and a resistive switching layer RL between the first electrode EL1 and the second electrode EL2. In one embodiment, the first electrode EL1 may be a lower electrode and the second electrode EL2 may be an upper electrode. It should be noted here that the terms, "the lower electrode and the upper electrode" are not to be construed as limiting any particular spatial orientation and are used only for identification purposes.

The first electrode EL1 and the second electrode EL2 may be two-dimensional planar bodies facing each other as shown in FIG. 1A, but the present invention is not limited thereto. For example, at least one of the electrodes of the first electrode EL1 and the second electrode EL2 may have a one-dimensional shape such as a wire, or may be a cylindrical shape, a protruding shape, a concave shape, or a three-dimensional shape of a combination thereof as the non-limiting examples.

The other electrode may have a one-dimensional shape or a three-dimensional shape that intersects or surrounds the other one.

In one embodiment, at least one of the first electrode EL1 and the second electrode EL2 may include at least any one of a semiconductor such as doped silicon or germanium; metals such as tungsten W, cobalt Co, nickel Ni, palladium Pd, platinum Pt, titanium Ti, tantalum Ta, molybdenum Mo, ruthenium Ru or erbium Er; the conductive silicon oxide thereof (for example, tungsten silicon oxide WSi, titanium silicon oxide $TiSi_2$, cobalt silicon oxide $CoSi_2$, nickel silicon oxide NiSi, platinum silicon oxide $PtSi_2$, erbium silicon oxide $ErSi_2$ or molybdenum silicon oxide $MoSi_2$); the conductive nitride thereof (for example, titanium nitride TiN or tantalum nitride TaN); and a conductive oxide thereof (for example, ruthenium oxide $RuO_2$ or strontium ruthenium oxide $SrRuO_3$). These materials are only illustrative, and the present invention is not limited thereto.

In one embodiment, at least one of the first electrode EL1 and the second electrode EL2 may include a rare metal layer such as platinum with low reactivity, and the other includes a reactive conductive compound layer (not shown) associated with reversible formation and disappearance of the conductive filament. For example, the reactive conductive compound layer may be a conductive oxide layer such as a ruthenium oxide layer or a strontium ruthenium oxide layer, which is an oxygen reservoir capable of forming a conductive filament, such as the above-described conductive oxide.

In one embodiment, at least one of the first electrode EL1 and the second electrode EL2 may have a laminated structure of two or more layers. For example, as shown in FIG. 1A, the first electrode EL1 may have a stacked structure of a conductive oxide layer OL which is an oxygen reservoir and a metal layer NL such as platinum.

In another embodiment, an epitaxial base layer may be further formed at the bottom of the first electrode EL1. The epitaxial base layer is a layer for crystallization in a predetermined direction of the resistive switching layer RL. The epitaxial base layer may be formed, i.e., at the bottom of the resistive switching layer RL prior to the deposition of the resistive switching layer RL or may be formed, i.e., at the upper side of the resistive switching layer RL after deposition of the resistive switching layer RL. When the epitaxial base layer is formed on the bottom of the resistive switching layer RL, the resistive switching layer RL may be epitaxially grown in situ. Conversely, if the epitaxial base layer is formed on the upper side of the resistive switching layer RL, the resistive switching layer RL may be crystallized through an additional process such as heat treatment after the formation of the resistive switching layer RL.

When the epitaxial base layer is a conductive layer, the epitaxial base layer may form part of the first electrode EL1 or the second electrode EL2. For example, the epitaxial base layer may be a strontium ruthenium oxide SRO thin film or substrate, such as a single crystalline or polycrystalline conductive perovskite material oriented in a Miller index 111. The SRO thin film is an oxygen-containing conductive metal oxide capable of supplying oxygen atoms to the resistive switching layer (RL) of the Brown-Millerite structure according to the applied bias polarity, as described above. In this case, the oxygen-containing conductive metal oxide may have a perovskite crystal structure. For example, the epitaxial base layer may comprise a layer of strontium ruthenium oxide SRO oriented in the Miller index 111 direction. A resistive switching layer (RL) may be formed directly on the SRO layer.

Alternatively, when the epitaxial base layer is an electrically insulating layer, the first electrode EL1 described above is formed on the epitaxial base layer, and the first electrode EL1 is epitaxially grown by the epitaxial base layer. The resistive switching layer RL formed subsequently may be epitaxially grown. For example, the epitaxial base layer may be a monocrystalline or polycrystalline non-conductive perovskite material in the Miller index 111 direction, such as a strontium titanium oxide (STO) thin film or substrate. A conductive thin film such as a strontium ruthenium oxide SRO layer which may be epitaxially grown in the Miller index 111 direction may be formed as a first electrode EL1 on the epitaxial base layer. Thereafter, a resistive switching layer RL may be formed on the first electrode EL1 so that the resistive switch layer RL may be epitaxially grown in the Miller index 111 direction.

At least one of the first electrode EL1 and the second electrode EL2 may be coupled to the conductive lines in the memory array. FIG. 1A illustrates the state that the first electrode EL1 is coupled to the first conductive line CL1 and the second electrode EL2 is coupled to the second conductive line CL2. In another embodiment, the first electrode EL1 or the second electrode EL2 itself may constitute at least a part of the conductive lines. In one embodiment, the first conductive line CL1 may be a word line and the second conductive line CL2 may be a bit line.

Although the embodiments described above primarily disclose a cell that constitutes a memory element, this is only for an illustrative purpose and it will be understood by the person skilled in the art that the first electrode EL1, the resistive switching layer RL, and the electrode EL2 are the non-limiting examples, and may be applied to the elements using a variable resistor which may be applied as fuses and anti-fuses, on/off switching elements of logic circuits such as an FPGA, or sensors such as surge detection.

The resistive switching layer RL may be an initial structure before the electroforming process and may have a crystalline structure having a Brown-Millerite structure. The Brown-Millerite structure may be polycrystalline or monocrystalline. The Brown-Millerite structure has a structure in which a layer having an octahedral structure and a layer having a tetrahedron structure alternate with each other, wherein the octahedral structure modifies the b-axis of the central metal atom located between the 8-coordinated lattices. In one embodiment, the resistive switching layer RL having the Brown-Millerite structure may include (Ba, Sr, Ca)$_2$(Fe, Co)$_2$O$_5$, Ca$_2$Al$_2$O$_5$, or Ca$_2$SiO$_4$ as a non-limiting example. Preferably, the Brown-Millerite structure may be a material having a perovskite crystal structure capable of performing reversible topotactic phase transition. The perovskite structure is a tetrahedral structure in the Braun Millerite structure and is formed by doping oxygen. For example, in connection with the formula, (Ba, Sr, Ca) (Fe, Co)O$_{2.5+x}$ 0<x<0.5, and the ideal perovskite structure, x satisfies x=0.5, but x may be a value between 0 and 0.5, such as 0.25, or 0.375, depending on the doped oxygen content. These phases have a smaller resistance value as compared with the Brown-Millerite structure and thus, they will have a conductive property.

In one embodiment, when oxygen is doped into the resistive switching layer (RL) of SrFeO$_{2.5}$ of the initial structure having a Brown-Millerite structure, a metal oxide of SrFeO$_{2.5+x}$ may be formed. SrFeO$_{2.5+x}$ may exhibit various kinds of perovskite crystal structures having oxygen depletion in SrFeO$_x$ (x=0~0.5) depending on the stoichiometry of oxygen. SrFeO$_3$ with X=0.5 is an oxide of cubic perovskite (hereinafter, may be referred to as P SFO) with a lattice constant of 3.851 Å and exhibits metallic electrical conductivity. The Neel temperature, T$_N$ of the SrFeO$_3$ is an antiferromagnetic magnetic body having 130 K. On the other hand, SrFeO$_{2.5}$ with X=0 is deficient in oxygen atoms and may have a structure of Brown-Millerite (hereinafter may be referred to as BM SFO) in which an octahedral layer of FeO$_6$ and a tetrahedral layer of FeO$_4$ are alternately stacked. The BM SFO has distorted orthorhombic unit cells (a$_0$=5.672 Å, b$_0$=1559 Å and c$_0$=5.527 Å). These orthorhombic unit cells may also be explained by quasi-tetragonal notation (i.e., a/√2=4.0107 Å, b/4=3.8975 Å and c/√2=3.9081 Å). The BM SFO is similar to the P SFO in that it is a semi-rigid body, but is completely different from the P SFO in that it is an electrical insulator.

The BM SFO may perform a reversible structural phase transition between P SFO and BM SFO, such as SrCoO$_x$ which is another example of Brown-Millerite structure. However, since BM SFO may grow uniformly according to a layer by layer mode, unlike SrCoO$_x$ which does not grow flatly at the atomic layer level (see the dissertation, "Epitaxial Growth and Valence Control of Strained Perovskite SrFeO$_3$ Films" written by Yamada, H and et al., and published in the 2002 edition "Appl. Phys. Lett), and thus, it may have a flat surface and uniform thickness at the atomic layer level.

In one embodiment, the thickness of the resistive switching layer RL may be in the range of 1 nm to 500 nm to in order to realize a stable, and low-power consuming, resistive switching operation. When the thickness of the resistive switching layer RL is less than 1 nm, it is difficult to obtain a uniform layer, and when the thickness exceeds 500 nm, power consumption for the electrical forming, setting, or reset operation may increase.

Referring to FIG. 1B, the non-volatile memory element 100 may include an array of memory cells MC arranged in a plurality of rows and columns. A set of conductive electrodes (hereinafter, it is called as word lines; WL1-WL4) may extend onto one end of the array of memory cells MC. Each word line may be electrically connected to the memory cells MC of the corresponding row. A different set of conductive electrodes (hereinafter, it is called as bit lines BL1-BL5) may extend onto the other end of the array of memory cells MC. Each bit line may be electrically connected to the memory cells MC in the corresponding column.

In the non-volatile memory element 100, each memory cell MC may be disposed at the intersection of one-word line and one-bit line. Such architectures are also commonly referred to as cross-point architectures. However, this in only for an illustrative purpose and the present invention is not limited thereto.

The read and write operations of a particular memory cell (referred to as the selected memory cell) may be performed by activating the word line and bit line associated with the selected memory cell. The non-volatile memory element 100 is coupled to the memory cells MC via each word line and may further include a word line control circuit (not shown) for activating the selected word line for reading or writing of the selected memory cell. In one embodiment, the word line control circuit may further comprise a multiplexer (not shown) for selecting a particular word line among the word lines.

The non-volatile memory element 100 may further include a bit line control circuit (not shown) coupled to the memory cells MC via respective bit lines BL1-BL5. In one embodiment, the bit line control circuit may include a demultiplexer, a sensing circuit, and an input/output (I/O) pad. The demultiplexer may be configured to selectively couple to the sensing circuit of a bit line of a selected memory cell.

The BM SFO layer, which is the resistive switching layer of the memory cell MC, is electrically nonconductive since it has a high resistance value in the initial state. Therefore, in order to enable the BM SFO layer to be used as a nonvolatile memory element, an electroforming process is required to reversibly convert the resistance state of the memory cell. When each memory cell is subjected to the electrical forming process, a conductive path such as a conductive filament electrically connecting the first electrode and the second electrode to each other is formed in the resistive switching layer of each memory cell, and it turns out that a reversible change of the resistance level may be made. When the conductive path is formed as described above, the write and erase operations for the memory cell may be performed reversibly.

The word line control circuit and the bit line control circuit may access the memory cells individually by activating corresponding word lines and bit lines coupled to the selected memory cells. During the write operation, the word line control circuit writes information to the selected memory cell by applying a predetermined voltage to the selected word line. The demultiplexer may activate the selected memory cell, for example, by grounding the selected memory cell. In this case, a logic value is written as a current that influences the characteristics of the memory cell is flowing into the selected memory cell.

These logic values may be stored by changing the resistance value of the resistive switching layer of each memory cell, and multi-bit logic value storage may be possible according to the number of resistance values. The state of the resistance value is detected through a subsequent read operation. The read resistance states may be used to represent one or more bits.

During programming or erase switching used to change the stored data, a specific switching voltage (e.g., a set voltage or reset voltage) is applied to the resistive switching layer (see RL in FIG. 1A). Thereby, a switching current is generated via the resistive switching layer and as a result, its resistance state will be changed. In connection with these currents, a heat may be generated in the resistive switching layer RL and/or at the interface between adjacent constituent members (e.g., the interface between the epitaxial base layer OL and the resistive switching layer RL, the interface between the epitaxial base layer OL and the first electrode EL1, or the interface between the resistive switching layer RL and the second electrode EL2). The generation and destruction of the conductive paths for changing the resistance state of the resistive switching layer RL will be described in more detail below with reference to FIGS. 2A to 2C.

The read operation for reading the changed data state by the write and erase operations described above may be performed by monitoring a resistance level of a memory cell through a small voltage signal, for example, "READ" voltage pulse, which does not substantially affect the conductive path in the resistive switching layer. In some embodiments, a read operation may be performed after the electrical forming and set/reset switching of the memory cell. In connection with the electrical forming and set/reset switching, the concerned voltage or the concerned current signal may be applied and increased until the desired resistance level for the selected memory cell is achieved.

During a read operation, the word line control circuit applies a predetermined voltage to the selected word line and the demultiplexer couples the selected bit line to the sensing circuit. The logic value of the selected memory cell is detected depending on the magnitude of the current detected by the sensing circuit, and the resulting value may be transferred to the I/O pad. When the memory cell is in the high resistance state, the sensing circuit may sense "OFF" current (IOFF), and when the memory cell is in the low resistance state, the sensing circuit may sense "ON" current (ION).

The width and/or the magnitude of the voltage pulse across the memory cell for programming or reading of the selected memory cell is adjusted and accordingly, the resistance value of the selected memory cell is adjusted. Therefore, a particular logic state may be written or read. The read operation may be affected by bypass of the signal such as the sneak path or the leakage current caused by the memory cells in the low resistance state adjacent to the selected other memory cell. Therefore, in connection with each memory cell in one embodiment, each element with certain non-linear properties that are connected in series to the variable resistor must be added to each node or to each element. In one embodiment, the non-linear elements may be coupled between the memory cell and the word line or between the memory cell and the bit line. As shown in FIG. 1A, a non-linear element DI may be provided between the first conductive line and the memory cell MC.

The non-linear elements may be diodes or elements of a varistor type. In FIG. 1A, a reverse diode DI is illustrated. The reverse diode may be a Zener diode. The threshold voltage Vth of the reverse diode may have a value smaller than the write voltage. In this case, the current flows through the reverse diode and the memory cell while writing to the selected memory cell, and the current flowing in the reverse direction is cut off by the voltage applied to the adjacent memory cells. The magnitude of the read voltage may be less than the threshold voltage Vth of the reverse diode. For example, the magnitude of the read voltage may be half of the threshold voltage Vth of the reverse diode. However, a step for selecting a memory cell in the cross-point structure may be performed by a half selection method, and the present invention is not limited to this example.

In one embodiment, the rectifying characteristic of such a reverse diode may be realized in the variable resistor itself when the variable resistor has a self-rectifying characteristic. In this case, the configuration and manufacture of the semiconductor memory element may be remarkably simplified by omitting the reverse diode.

In another embodiment, when a transistor is placed at each node, or is inserted into each memory cell and thus, a memory cell is not selected, a configuration of an active matrix that decouples unselected memory cells may be realized. This approach may improve the crosstalk problem that arises in arrays of nonvolatile memory elements.

Although the nonvolatile memory element according to the above-described embodiment is described as having a memory cell array of one layer, this is only for illustrative purpose and the present invention is not limited thereto. For example, two or more memory cell arrays may be stacked and integrated. Further, the memory array shown in FIG. 1B may have a three-dimensional memory cell array that is extended horizontally with respect to the substrate or extended to have a plurality of levels in a direction perpendicular to the substrate.

Figure 2A:
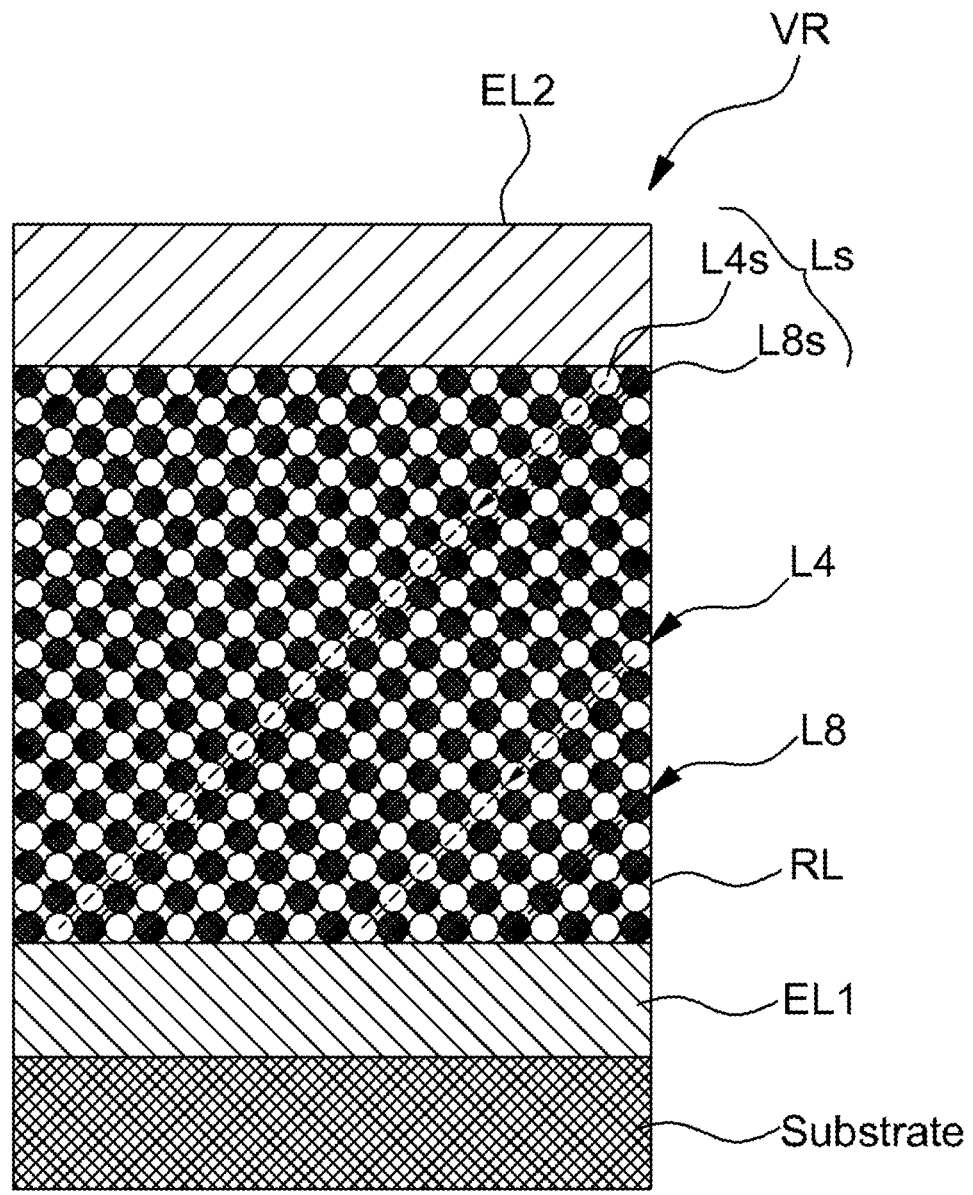
FIG. 2A shows an initial state of a variable resistor formed according to an embodiment of the present invention.
Figure 2B:
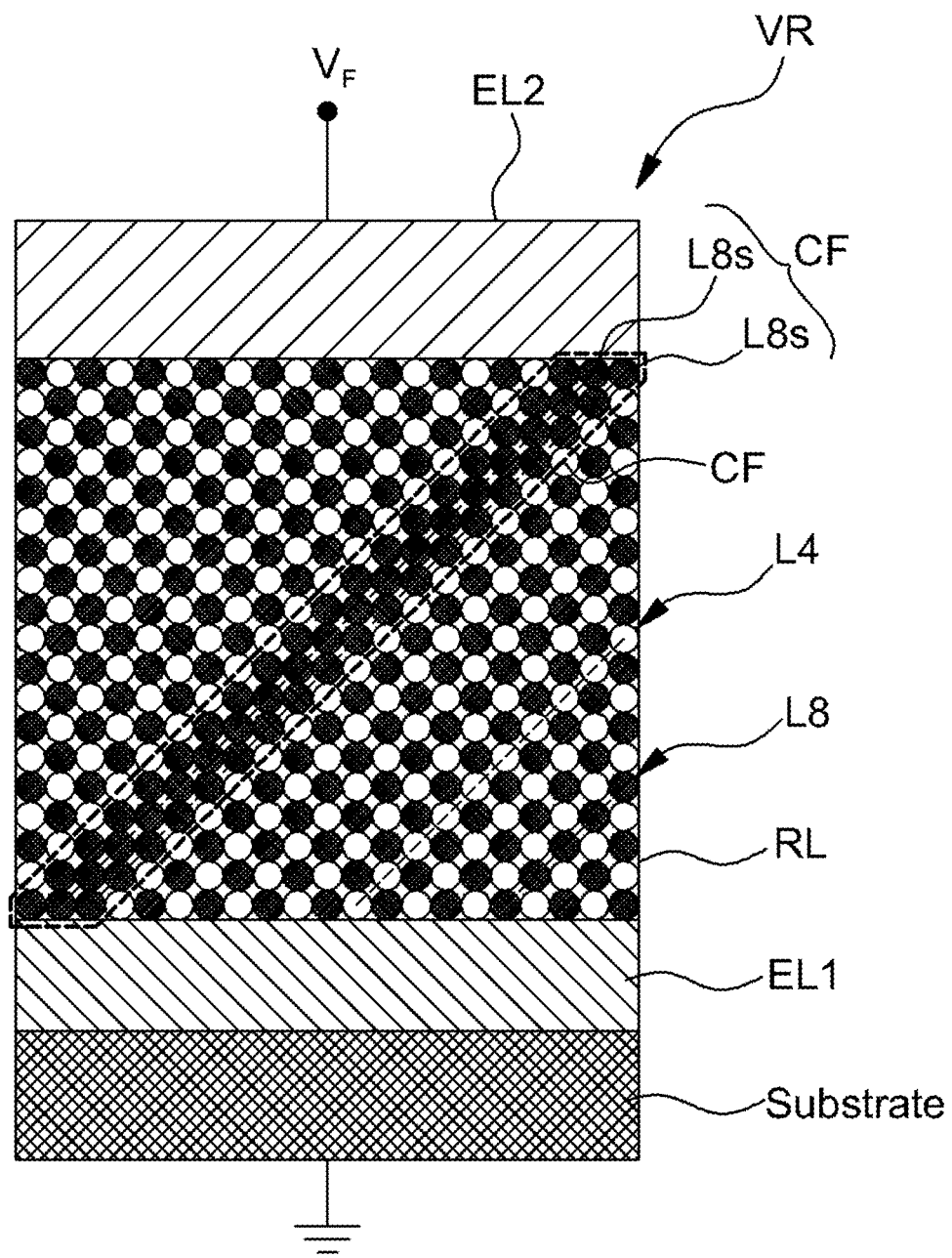
FIG. 2B shows a conductive path formed in a variable resistor by an electrical forming process.
Figure 2C:
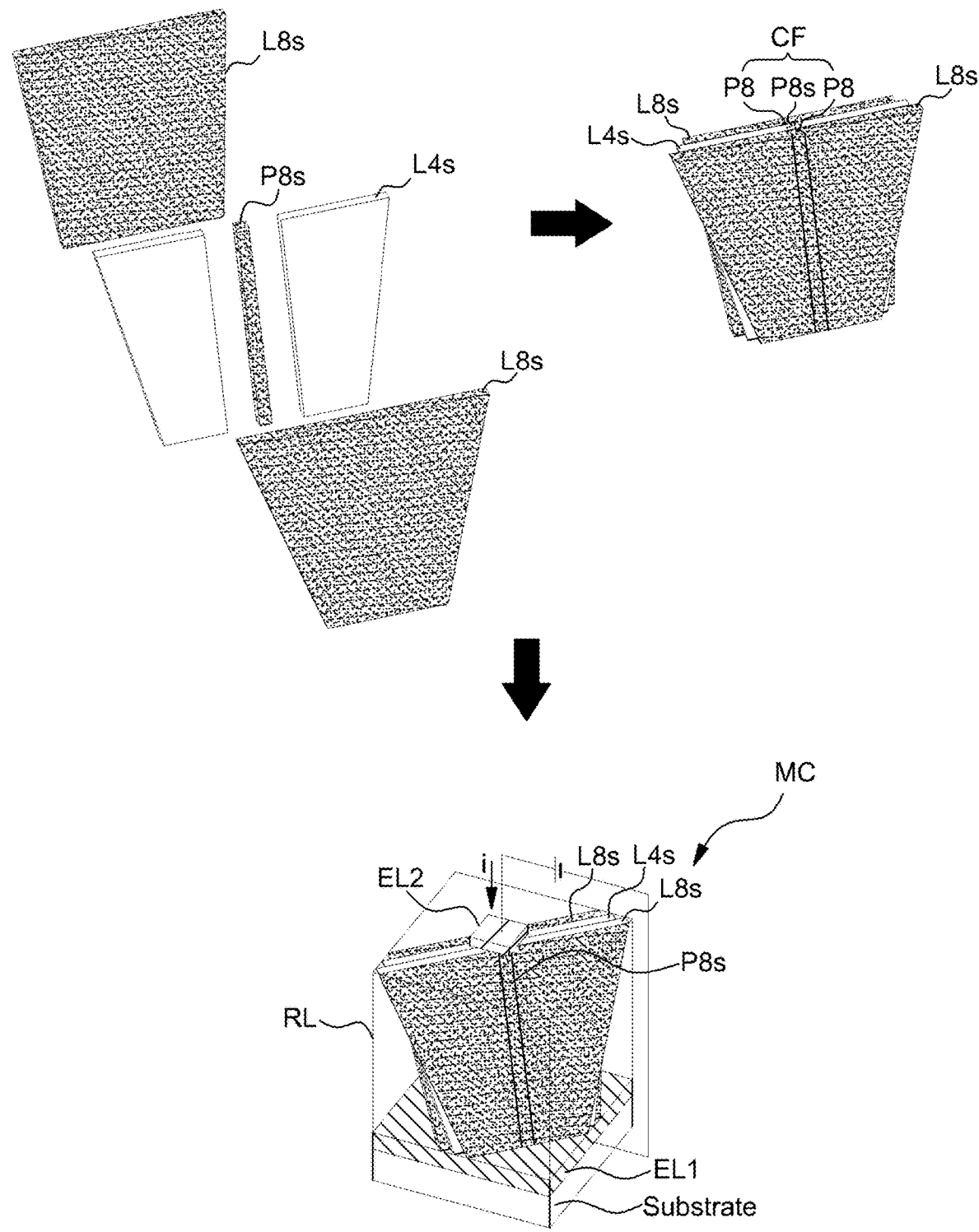
FIG. 2C shows a schematic diagram for explaining a conductive path of FIG. 2B
Figure 2D:
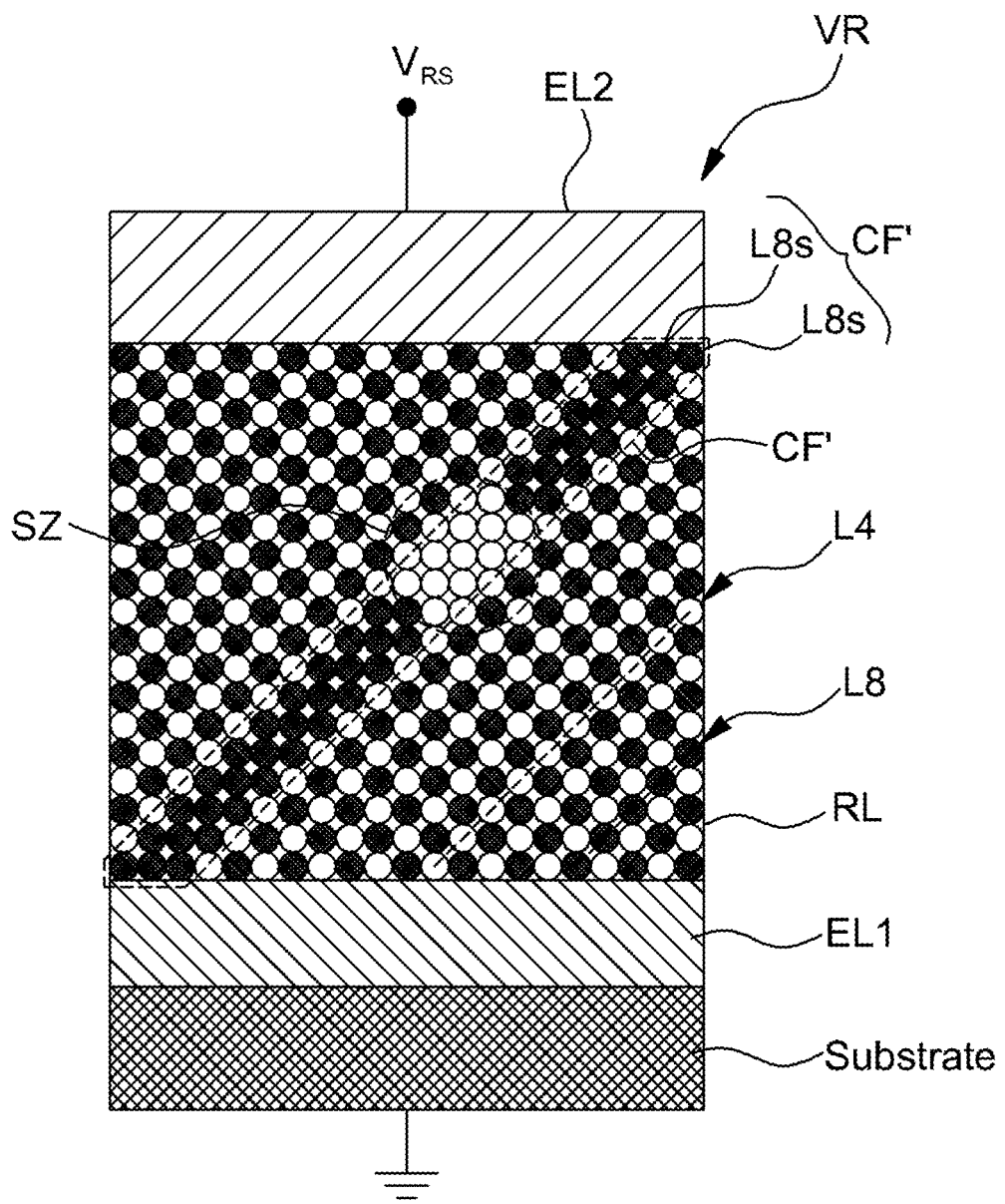
FIG. 2D is a cross-sectional view showing a state in which the formed conductive path is ruptured.

FIG. 2A shows an initial state of the variable resistor VR formed according to an embodiment of the present invention, FIG. 2B shows a conductive path formed in the variable resistor by an electrical forming process, FIG. 2C shows a diagram illustrating a conductive path of FIG. 2C, and FIG. 2D is a cross-sectional view showing a state in which the formed conductive path is collapsed.

Referring to FIG. 2A, a variable resistor VR including a first electrode EL1, a second electrode EL2, and a resistive switching layer RL is disclosed. The variable resistor VR may be applied as a member such as the memory cell, the sensor, the fuse or the logic element described above.

The resistive switching layer RL between the first electrode EL1 and the second electrode EL2 has a Brown-Millerite structure preferentially oriented and crystallized in the direction of the Miller index 111 as an initial structure. The Brown-Millerite structure has a crystal structure in which a completely oxidized octahedral structure layer L8 and an oxygen-depleted tetrahedral structure layer L4 alternate. Although a single crystal structure is shown, the present invention is not limited thereto, and the resistive switching layer may have a polycrystalline structure. The above-described strontium iron oxide SFO among the Brown-Millerite materials may be grown in atomic layer units, so that a flat layer may be obtained at the atomic layer level. In one embodiment, the resistive switching layer RL illustrated in FIG. 2A may include a SFO layer of Brown-Millerite structure preferentially oriented in the Miller index 111 direction. The resistive switching layer of the Brown-Millerite structure of the initial structure is an insulator including a structural order having a resistance value larger than that of the high resistance state by the reset operation to be described later.

In one embodiment, some of the layers L8s of the octahedral structure layers L8 extending in the Miller index 111 direction contact the first electrode EL1 and the second electrode EL2 in an intersecting manner, and thereby, the first electrode EL1 and the second electrode EL2 may be connected. As described above, the octahedral structure layers L8s connecting the first electrode EL1 and the second electrode EL2 are referred to as the octahedral slab layers in this specification. As a result of reviewing the characteristics of the Brown-Millerite structure, it is to be understood that there is a tetrahedral structure layer L4 between these adjacent octahedral layers L8, and in particular, the tetrahedral structure layers L4s are also formed between the octahedral slab layers L8s. In this specification, this is referred to as a tetrahedral slab layer. The octahedral slab layers may be at least more than one layer and need not necessarily be plural. In the present specification, the octahedral slab layers L8s and the tetrahedral slab layers L4s are collectively referred to as an initial slab layer Ls.

The slab layer Ls is a crystalline region connecting the first electrode EL1 and the second electrode EL2 in an intersecting manner in the resistive switching layer of the initial structure. If the Brown-Millerite structure is oriented in a direction not parallel to the main direction of the substrate or the electrodes EL1, EL2, for example, the direction of the Miller index 111 other than the direction of the Miller index 100, and the resistive switching layer RL has a suitable thickness, one or a plurality of slab layers Ls may be secured.

The filament conductive path of the resistive switching layer RL according to the embodiment of the present invention may be provided when at least a part of the tetrahedral slab layer L4s is oxidized and transformed into an octahedral layer, in the initial slab layer Ls of the Brown-Millerite structure passing across the first electrode EL1 and the second electrode EL2 of the variable resistive element VR. As described above, the variable resistor RL having the Brown-Millerite structure of FIG. 2A is electrically nonconductive before undergoing the electrical forming process. However, referring to FIG. 4B, during the electrical forming process, for example, when the positive forming voltage signal VF is applied to the second electrode EL2 and the first electrode EL1 is grounded (in this case, the oxygen supply layer (see OL in FIG. 1A) may be included in the first electrode EL1), the oxygen anions are drifted into the resistive switching layer RL. The drifting oxygen anion is doped into the resistive switching layer L so that the oxygen-depleted tetrahedral slab layers L4s of FIG. 2A may be oxidized to become the octahedral slab layer L8s. In this case, a planar conductive filament in which three or more layered structures are combined may also be formed.

In another embodiment, referring to FIG. 2C, during the electrical forming process, a part P8S of the tetrahedral slab layer L4s disposed between the adjacent octahedral slab layers L8s is changed into the octahedral structure via an oxygen injection. A region P8S changed into an octahedral structure is combined with a neighboring octahedral slab layers L8s neighboring in order to form the rod-shaped conductive filament CF. It is illustrated that a conductive path is formed between the first electrode EL1 and the second electrode EL2 by the conductive filament CF.

The shape of the conductive filament described with reference to FIGS. 2B and 2C is merely exemplary and thus, the present invention is not limited thereto. Further, the number of the conductive filaments may be a plural type or may have any shapes combined with a plane shape and a rod shape. For example, when the Brown-Millerite crystal structures of different orientations are mixed in the resistive switching layer RL, two or more planar shapes may cross each other, or two or more rod shapes may cross each other, or a planar shape and a rod shape may be combined to form a composite structure.

In the embodiment of the present invention, since the tetrahedral slab layers L4s of oxygen depletion have various oxygen coordination sites, it is easy to oxidize and the stress due to the deformation generated when changing into the octahedral structure may be accommodated. Therefore, the phase change may easily occur. That is, oxygen ions are doped between the completely oxidized octahedral slab layers L8s adjacent to each other, and a conductive filament is formed through a topotactic phase transition in which the tetrahedral slab layers L4s partially changed into the perovskite crystal structure.

In one embodiment, during the electrical forming process, the first electrode EL1 is in contact with the ground, the biasing is applied to the second electrode EL2, and at this time, the forming voltage VF applied to the second electrode EL2 may be in the range of 0.4 V to 2 V. In some embodiments, the forming voltage VF applied to the second electrode EL2 may be 0.5 V to 1V. However, this voltage range is only exemplary, and when the Brown-Millerite structure of the resistive switching layer RL is substantially single crystal, the cell operation and the reset operation may be performed reversibly without the electrical forming process. In this case, the forming voltage VF may not be required, and substantially corresponds to the case where the forming low voltage VF is 0 V. As described above, the main reason why the forming voltage VF is small or zero is as follows. That is, when at least a part of the rod shape is transferred to the octahedral structure in the tetrahedral slab layer disposed between the adjacent octahedral slab layers, it is easily generated so that energy may not be needed.

According to the embodiment of the present invention, before the electrical forming process, the octahedral slab layers L8s constituting a part of the conductive filament CF connects the portion between the first electrode EL1 and the second electrode EL2 in advance. Further, even if the tetrahedral slab layer L4s between the octahedral slab layers L8s are at least partially oxidized, the conductive filament CF may be formed. Therefore, the forming voltage VF required in the electrical forming process may be considerably reduced, as compared with the conventional filament forming mechanism generated in a resistive switching layer using the conventional metal oxides such as nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide, which move the defects in substantial parts between the first electrode EL1 and the second electrode EL2 and arrange these defects in one or more initial conductive paths to form a conductive leg. Therefore, according to the embodiment of the present invention, since the electrical forming voltage is substantially reduced to a level lower than the set voltage and the reset voltage or the voltage is 0, there is an additional advantage that the dielectrical breakdown phenomenon of the resistive switching layer occurring at the conventional high electrical forming voltage may be avoided.

Further, in one embodiment, if the thin film constituting the resistive switching layer RL is a thin film of SFO layer, the resistive switching layer RL may be formed in a layer by layer manner. Thus, it is possible to grow uniformly at a uniform level with a flat surface at the atomic level and accordingly, there is a merit that the cascading generation of the conductive filament occurring in the Brown-Millerite structure may be generated more uniformly. When applying a variable resistor as memory element, variations in performance between memory cells may be mitigated.

It will be understood by those skilled in the art that the above-described embodiment relates to a resistive layer of a Brown-Millerite structure preferentially oriented in the 111 direction, but the orientation of the slab layer for reducing power consumption in the electrical forming process is limited to the Miller index 111 direction, and may have any inclined direction that may cross the first electrode and the second electrode, and this is also included in the embodiment of the present invention.

In the electrical foaming process, the current level in the resistive switching layer RL suddenly increases, which corresponds to the beginning of the electrical forming process. The resistive switching layer RL remains in the low resistance state LRS by the conductive filament CF formed even when the bias is removed. In an embodiment of the present invention, the write and erase operations are performed through a process that a part of the conductive filament CF being partially cut off and restored, rather than being performed over the resistive switching layer RL. Referring to FIG. 2D, in this specification, the region in which the conductive filament CF is partially blocked or restored is referred to as a switching zone SZ.

The conductive path CF formed on the basis of the slab layers L8s may be at least partially ruptured under a reverse bias VRS condition opposite to the bias VF of the electrical forming. The oxygen ions filled in the conductive filament CF by the reverse bias VRS drift again toward the first electrode EL1. At this time, the resistive switching layer RL is not entirely reduced, but undergoes a process in which at least a portion of the conductive filament CF, that is, the switching zone SZ, is reduced. Whereby the continuous conductive filament CF is ruptured and a system of a tetrahedron structure of at least partially reduced may be generated in the switching zone SZ of the cut conductive filament CF. At this time, the resistive switching layer RL becomes a high resistance state HRS. Thus, the occurrence of switching from the low resistance state LRS to the high resistance state HRS may be referred to as a reset operation.

In one embodiment, the first electrode EL1 is grounded and a negative voltage (hereinafter, referred to as a reset voltage VRS), for example, a reset voltage of −1 V to −3 V is applied to the second electrode EL2. It is preferable that a reset voltage of −1.5 V to −2.2 V is applied. Then, the resistive switching layer becomes a high resistance state HRS.

Again, a process for applying a high positive bias to the resistive switching layer RL in the high resistance state LRS will cause at least a portion of the ruptured conductive filament CF', for example, the tissue of the tetrahedron structure in cluster form to be oxidized. Whereby the conductive filament CF is again rebuilt as shown in FIGS. 2B and 2C, and the resistive switching layer RL becomes the low resistance state LRS. This operation is referred to as a set operation, and the voltage required for the set operation is referred to as a set voltage (VS). In one embodiment, the set voltage (VS) is in the range of 0.9 V to 1.5 V. The cell voltage VS connects the ruptured octahedral chain and thus, is higher than the above-described electrical forming voltage VF.

The set voltage VS applied to the selected memory cell and the reset voltage VRS cause the selected memory cell to be switched reversibly between the low resistance state LRS shown in FIG. 2B and the high resistance state RLS shown in FIG. 2C. In the above-described embodiment, the oxidized octahedral slab layers L8s constituting the conductive filament CF have a perovskite crystal structure, for example, $SrFeO_{3.0}$ and may have the number of layers within the range in which at least quantum confinement effect does not generate, that is at least more than two layers. The present invention is not limited thereto. However, in another embodiment, the conductive filament CF may have a perovskite crystal structure containing oxygen content larger rather than that of $SrFeO_{2.5}$ of Brown-Millerite structure, like $SrFeO_{2.75}$ or $SrFeO_{2.875}$.

The variable resistor VR according to the embodiment of the present invention is characterized in that it has a bipolar switching operation characteristic opposite to the direction of the current applied to the variable resistor VRT for performing the reset operation for cutting off the switching zone SZ of the conductive filament CF and the set operation for restoring parts of cutoff part of the switching zone SZ and re-configuring the conductive filament CF. When applying the variable resistor VR as the memory cell, the switching zone SZ may include the octahedral slab layers L8s of the Brown-Millerite structure across the first electrode EL1 and the second electrode EL2; and at least a part of the tetrahedral slab layer L4s between the octahedral slab layers, for example, in the vicinity or entire portions of the first electrode EL1 or the second electrode EL2. The present invention is not limited thereto. The reversible phase change of the switching zone SZ may be performed by controlling the movement of the oxygen anions, and oxidation and reduction reaction of the octahedron layer and the tetrahedron layer, particularly the tetrahedron layer constituting the switching zone SZ may be controlled by the movement of the oxygen anions. Therefore, the electrical forming process of the memory cell, and the recording/erasing operations of information may be controlled.

In some embodiments, the locations of the switching zones SZ are designed to apply uniformly throughout the memory cells of the memory cell array so that all cells belonging to the same memory array may have the same characteristics. However, this is only exemplary, and the location of the switching zone SZ of each memory cell may be independently selected for each cell by controlling the electrical forming process. For example, the switching zone SZ of some memory cells may be formed in the vicinity of the first electrode EL1, and the switching zone SZ of the other memory cells may be formed in the vicinity of the second electrode EL2.

In another embodiment, the location of the switching zone SZ may be initially formed at one specified location and then is altered through electrical control to move to another location. Thus, a memory cell region having different operation characteristics or data storage characteristics in a memory cell may be provided. The design and change of the position of the switching zone SZ may be achieved by controlling the movement of the oxygen anion. The movement control of the oxygen anion may be achieved by controlling the polarity, intensity, and/or duration time of the electrical signal to be used.

Figure 3A:
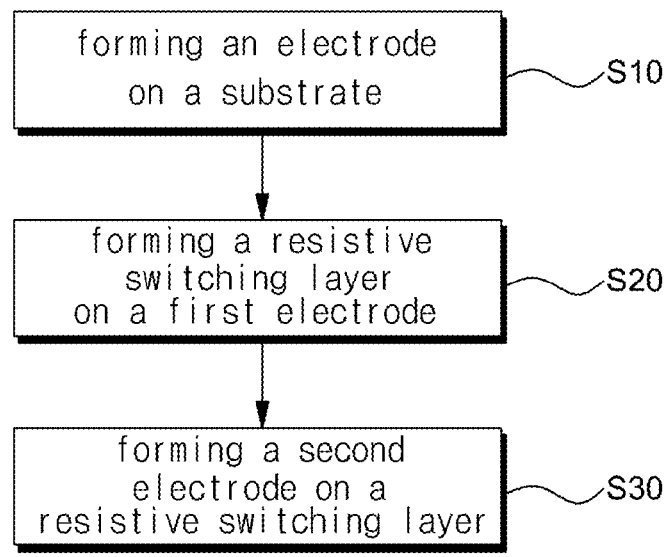
FIG. 3A and FIG. 3B shows flowcharts for explaining a method of manufacturing a variable resistor according to various embodiments of the present invention.
Figure 3B:
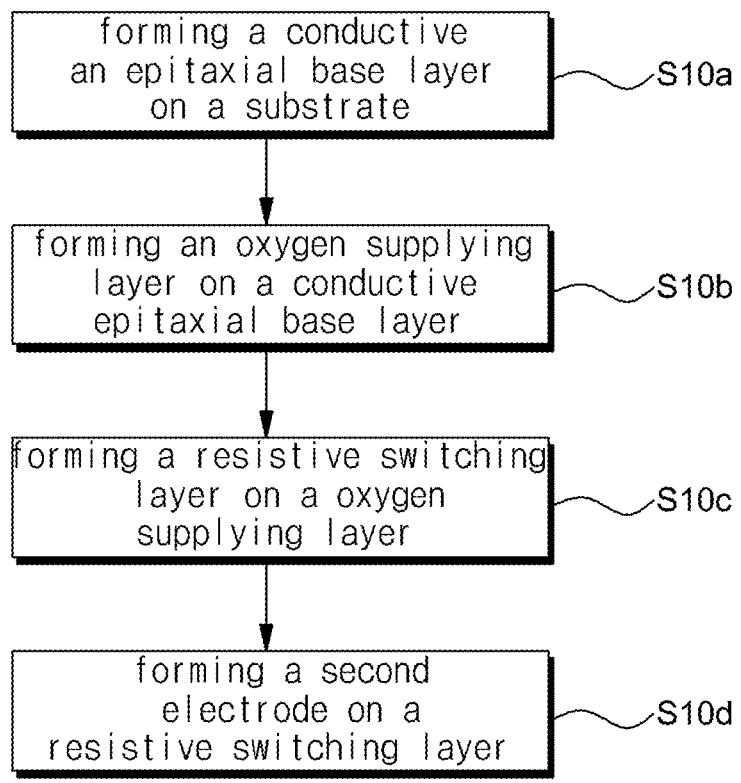

FIG. 3A and FIG. 3B are flowcharts for explaining a method of manufacturing a variable resistor according to various embodiments of the present invention.

Referring to FIG. 3A, a first electrode is formed on a substrate (S10). A conductive thin film forming process such as physical vapor deposition, for example, sputtering or laser fusing, chemical vapor deposition, or atomic layer deposition may be applied to the first electrode. A resistive switching layer is formed on the first electrode (S20). Then, a second electrode is formed on the resistive switching layer (S30).

In one embodiment, a step for forming the first electrode (S10) may include forming an epitaxial base layer (S10a) on the substrate, as shown in FIG. 3b. In this case, the first electrode may be composed of only the epitaxial base layer, or may be provided in the form of a laminated structure by forming the epitaxial base layer on the first conductive layer such as doped crystalline silicon, titanium or tungsten. In addition, in one embodiment, the step for forming the first electrode (S10) may further include a step for forming an oxygen supply layer (S10b) on the epitaxial base layer. In this case, the epitaxial base layer and the oxygen supply layer may constitute at least a part of the first electrode as a conductive layer of a laminated structure. The oxygen supply layer may be preferentially oriented in a predetermined direction by the epitaxial base layer and crystallized.

The epitaxial base layer may be a perovskite-based conductive layer oriented in the Miller index 111 direction, as described above with reference to FIG. 1A. For example, the epitaxial base layer may be a strontium ruthenium oxide film. If the conductive epitaxial base layer functions as an oxygen supply layer, the first electrode may be provided only by the conductive epitaxial base layer. The epitaxial base layer makes it possible to perform a hetero epitaxial growth in which a selective oxygen supply layer to be formed subsequently and a resistive switching layer of a Brown-Millerite structure are preferentially oriented in the Miller index 111 direction to crystallize.

The epitaxial base layer may include a non-conductive perovskite-based material, for example, a strontium titanium oxide film. In this case, on the non-conductive perovskite material layer, a first electrode such as a strontium ruthenium oxide film or ruthenium oxide film may be formed. In this case, both the strontium ruthenium oxide film formed on the strontium titanium oxide film in the direction of the Miller index 111 as the epitaxial base layer and the resistive switching layer having the Brown-Millerite structure can be heteroepitaxially crystallized in the Miller index 111 direction. The heteroepitaxial crystallization may be accomplished in situ when the first electrode and the resistive switching layer are deposited, or may be accomplished through a subsequent heat treatment, but the present invention is not limited thereto.

The aforementioned epitaxial base layer may be provided in the same bulk form as the substrate or may be a crystalline thin film formed by a vapor deposition method such as pulsed laser ablation, sputtering, chemical vapor deposition or atomic layer deposition.

The resistive switching layer formed on the first electrode is a variable resistance layer having a Brown-Millerite structure. In one embodiment, the resistive switching layer may be formed by pulsed laser ablation. For example, the substrate may be heated to a temperature in the range of about 500° C. to 800° C. and the resistive switching layer may be formed by pulsed laser ablation with laser fluences of 1 J·cm$^{-2}$ to 10 J·cm$^{-2}$ and a repetition rate of 1 Hz to $10^3$ Hz under a pressure of 0.1 mTorr to 100 mTorr. A high-purity ceramic target containing the constituent elements of the resistive switching layer for the pulsed laser ablation method may be used as a starting material. However, the pulsed laser ablation method is an illustrative one and other vapor deposition methods such as sputtering, chemical vapor deposition, atomic layer deposition, or molecular beam epitaxy may be applied. The resistive switching layer has a Brown-Millerite structure and is preferentially oriented in the direction of the Miller index 111 by an underlying base layer of the base, and can be crystallized.

Crystallization of the resistive switching layer may be accomplished in situ with its thin film deposition or ex situ through an after-heat treatment. Thereafter, a variable resistor may be provided by forming a second electrode on the resistive switching layer (S30). After forming a variable resistor, a variable resistor capable of reversibly changing a resistance value level may be provided by forming conductive filaments in the resistive switching layer through an electrical foaming process Experimental Example A resistive switching layer according to an embodiment of the present invention was fabricated and its characteristics were analyzed. For the fabrication of the resistive switching layer, a polycrystalline strontium iron oxide SFO target of 99.9% purity was used. The strontium iron oxide target was prepared by stoichiometrically mixing $SrCo_3$ and $Fe_2O_3$ as a starting material, calcining at 900° C. for 12 hours, and sintering at about 1000° C. for 12 hours.

As the first electrode, a strontium ruthenium oxide SRO film was formed. At this time, a strontium titanium oxide STO substrate having a perovskite crystal structure oriented in a Miller index 111 as an epitaxial base layer was used to make the crystal orientation of the strontium ruthenium oxide SRO film to 111. Thereby, the strontium ruthenium oxide SRO film epitaxially grows on the substrate, and has a crystallinity oriented in the Miller index 111. The first electrode was formed by a pulse laser evaporation method using a KrF excimer laser (repetition rate: 4 Hz, fluence: ~2.5 J·cm$^{-2}$), and the temperature of the substrate was 750° C. The strontium ruthenium oxide SRO film has an out-of-plane lattice constant of about 3.95 Å.

A strontium iron oxide SFO film of Brown-Millerite structure was formed as a resistive switching layer on the strontium ruthenium oxide SRO film. The SFO film was deposited by pulsed laser evaporation of a KrF excimer laser (repetition rate: 4 Hz, fluence: ~2.1 J·cm$^{-2}$) at a substrate temperature of about 650° C. under a pressure of about 10 mTorr. The thickness of the strontium ruthenium oxide SRO film is about 80 nm.

Thereafter, a gold (Au) thin film having a thickness of about 80 nm was formed as the second electrode by an electron beam evaporation method. Therefore, an epitaxial laminated structure of an Au thin film (second electrode)/BM SFO 111 thin film (resistive switching layer)/SRO 111 thin film (first electrode)/STO 111 (epitaxial base layer) was produced and its structural and electrical properties were evaluated.

Figure 4:
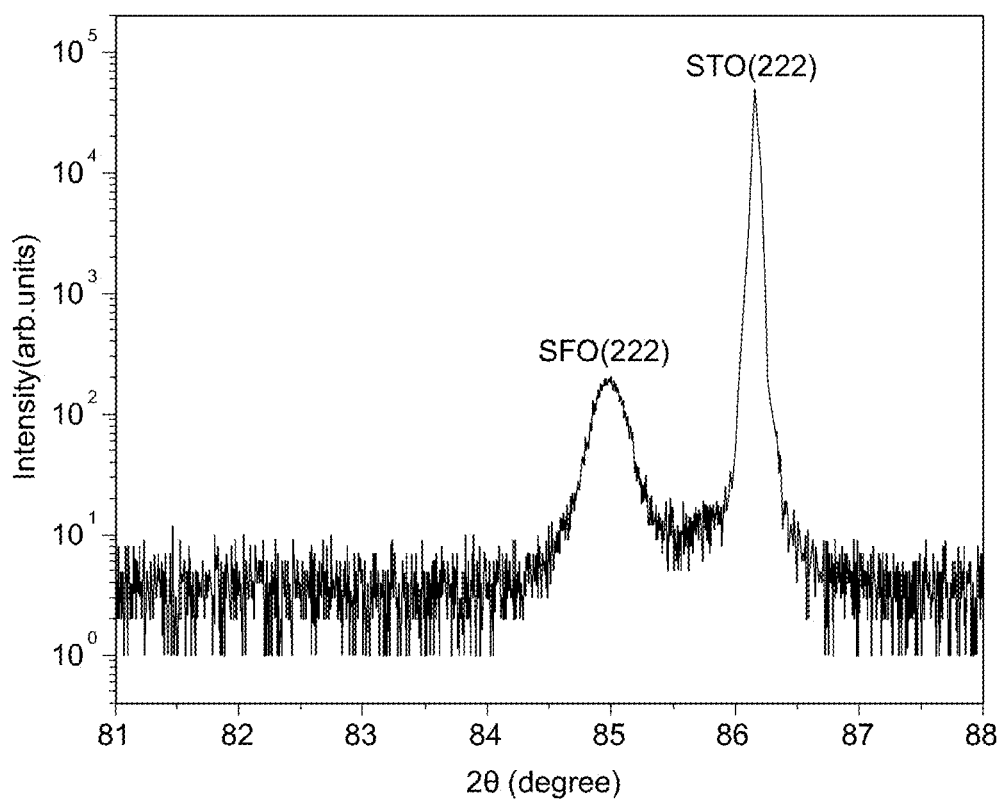
FIG. 4 shows the analysis results of high resolution X-ray diffraction of the epitaxial laminate structure according to an embodiment of the present invention.

FIG. 4 shows the analysis results of high resolution X-ray diffraction of the epitaxial laminated structure according to an embodiment of the present invention.

Referring to FIG. 4, diffraction peak of a Miller index 222, which is a superstructure of a multiple relationship, was detected from an STO thin film functioning as an epitaxial base layer and thus, it is to be understood that the epitaxial base layer includes a crystalloid oriented in a direction of a Miller index 111. Similarly, diffraction peak of a Miller index 222 was detected from the BM SFO thin film functioning as a resistive switching layer, and thus, it is to be understood that the BM SFO thin film was preferentially oriented in the direction of the Miller index 111 and crystallized. The average lattice constant of the formed BM SFO thin film was 3.988 Å. It can be seen that other Bragg diffraction peaks are not observed and thus, they have considerably pure crystalloids.

In this embodiment, the BM SFO thin film is in-situ crystallized without heat treatment, but the present invention is not limited thereto. The STO thin film deposited through the subsequent heat treatment after the formation of the SFO thin film may be crystallized into a Brown-Millerite structure. In addition, the epitaxial base layer is only an example, and the present invention is not limited thereto. For example, the conductive thin film constituting the first electrode may be replaced with an epitaxial base layer as a conductive thin film having a perovskite crystal structure oriented in the 111 direction or a thin film having another perovskite crystal structure as an epitaxial base layer may be used.

Figure 5:
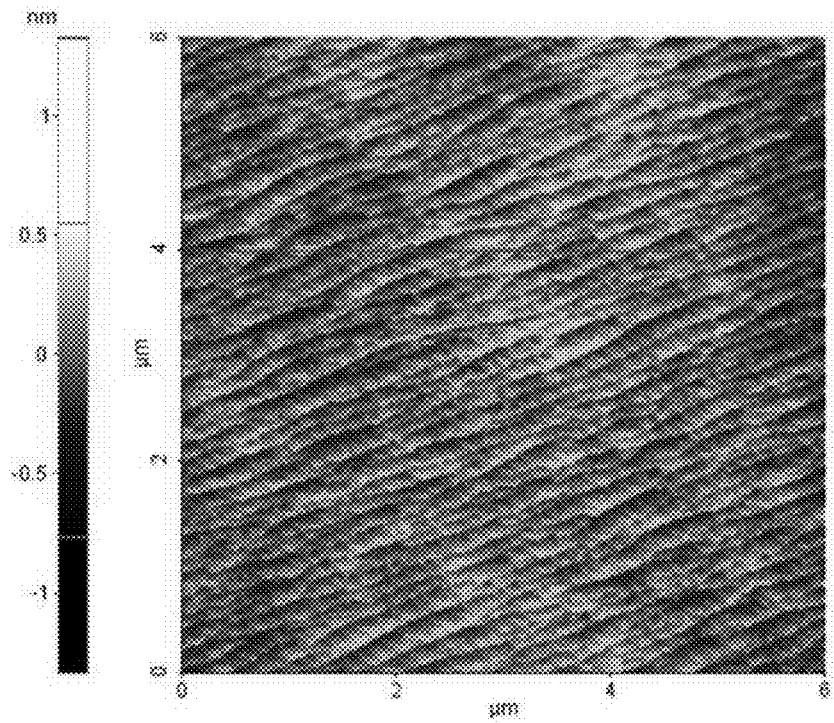
FIG. 5 shows an atomic force microscope image of a BM SFO thin film which is a resistive switching layer of an initial structure according to an embodiment of the present invention.

FIG. 5 is an atomic force microscope image of a BM SFO thin film which is a resistive switching layer of an initial structure according to an embodiment of the present invention.

Referring to FIG. 5, it can be seen that the BM SFO thin film according to the embodiment of the present invention has a flat surface at an atomic level and is formed into a step terrace structure. On the average, a step of 0.4 nm height and a terrace structure of about 400 nm width were observed. Thus, it can be assumed that the BM SFO thin film according to the embodiment of the present invention is formed according to a step flow growth mode. However, the present invention is not limited to this growth mode, and this is merely exemplary.

Figure 6A:
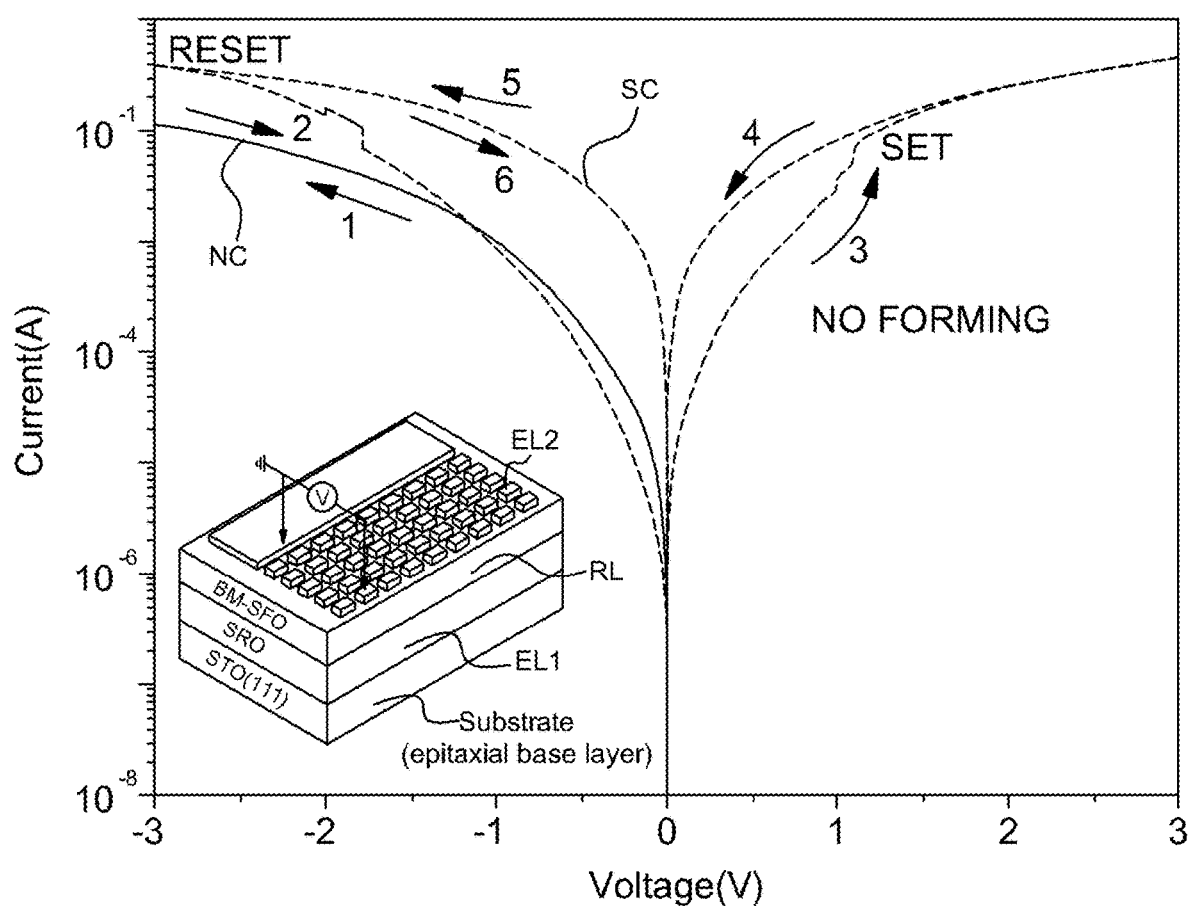
FIG. 6A shows a graph showing current-voltage characteristics of a memory cell having a resistive switching layer RL according to the embodiment of the present invention.
Figure 6B:
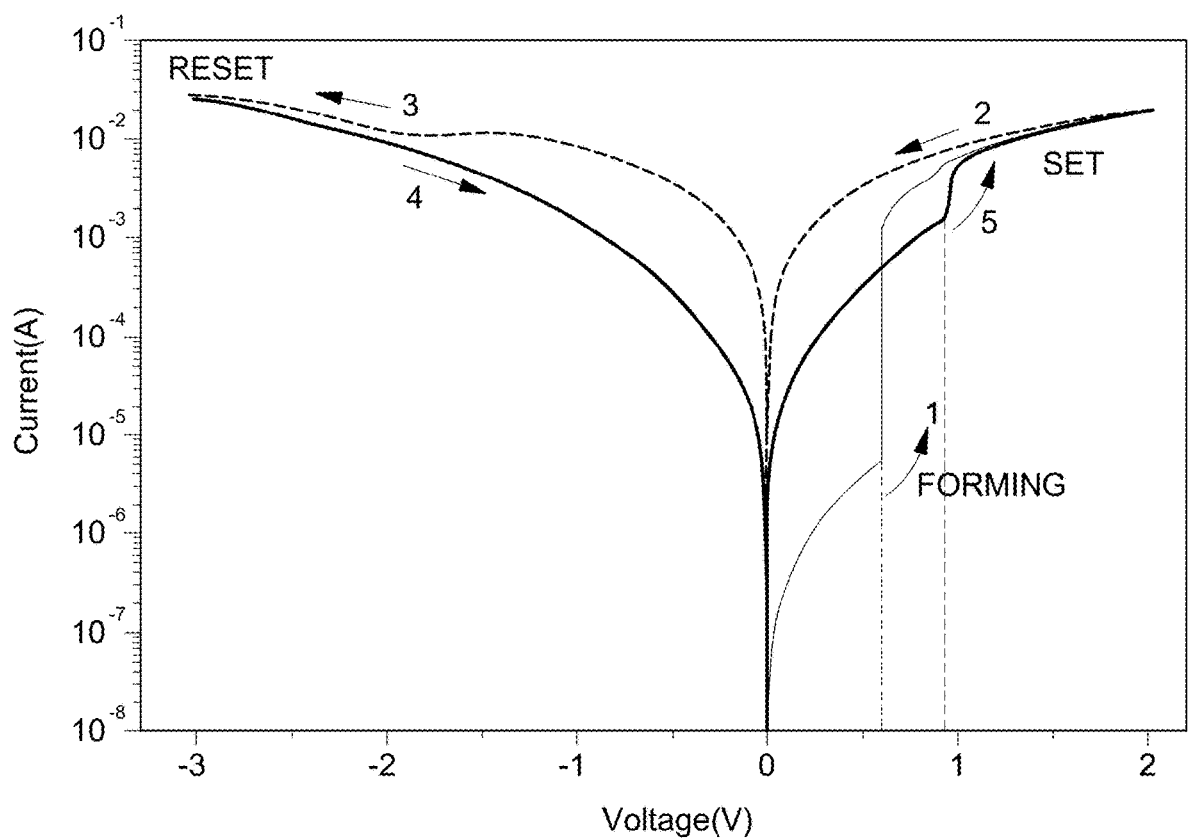
FIG. 6B shows a graph showing current-voltage characteristics of the memory cell having the resistive switching layer RL' of the SFO crystallized in the Miller index 100 direction Voltage behavior according to the comparative example.

FIG. 6A is a graph showing current-voltage characteristics of a memory cell having a resistive switching layer RL according to the embodiment of the present invention, and FIG. 6B is a graph showing the current-voltage characteristics of the memory cell having the resistive switching layer RL' of the SFO crystallized in the Miller index 100 direction according to the comparative example.

Referring to FIG. 6A, a memory cell for measurement is manufactured by forming a first electrode EL1 (for example, an SRO electrode capable of supplying oxygen ions) as a common electrode, and a second electrode EL2 (for example, an Au electrode), according to the structure illustrated in 6A. The I-V sweep was performed while applying a variable bias to the second electrode EL2 and grounding the first electrode EL1.

According to embodiments of the present invention, it has been observed that bipolar hysteresis characteristics may be implemented without an electrical foaming process. When the voltage sweep is performed in the negative direction first as shown by the arrow 1, as indicated by the curve NC for the variable resistor having the initial structure, the resistive switching characteristic does not appear along the path of the arrow 2 as it is. Therefore, it can be seen from this that the conductive filament according to the embodiment of the present invention is formed by oxygen ions supplied from the first electrode EL1. In addition, due to the selectivity for such polarity, the memory cell of the present invention may have a self-rectifying effect in which the current flows only in the specified polarity, and a simpler memory cell array in which the selection element is omitted may be realized by using these characteristics.

Referring to the curve SC, when the positive bias is increased as shown by arrow 3, the SET operation is performed even though there is no separate electrical forming process, and the resistive switching layer RL becomes the low resistance state (LRS). When the positive bias is reduced as indicated by the arrow 4 and a negative voltage is applied as shown by arrow 5 and thus a RESET operation is performed, the resistive switching layer RL is turned to the high resistance state (HRS) as indicated by the arrow 6.

Referring to FIG. 6B, unlike the embodiment of the present invention, the memory cell according to the comparative example requires an electrical forming process at a low voltage VF of about 0.6 V, which is low as indicated by arrow 1. Thereby, the resistive switching layer RL' becomes the low resistance state LRS. When the voltage applied in the low resistance state LRS is decreased, the path shown by the arrow 2 is selected.

Thereafter, a reset operation is performed as indicated by arrow 3 at a negative bias state. The memory cell becomes a high resistance state HRS as indicated by arrow 4. Then, when a positive bias is applied, the set operation is performed as indicated by the arrow 5, and the memory cell is again switched to the low resistance state LRS. A typical bipolar hysteresis characteristic also appears in the memory cell according to the comparative example, and the electrical forming voltage VF is lower than the set voltage VS.

The variable resistor according to the embodiment of the present invention uses a resistive switching layer having a Brown-Millerite structure crystallized in an inclined orientation across the first electrode and the second electrode as an initial structure. Therefore, a variable resistor having bipolar characteristics may be provided without a substantial electrical forming process. Also, as a result of evaluating the I-V characteristics in the various memory cells shown in FIG. 6A, it was confirmed that there is almost no characteristic deviation between the memory cells according to the embodiment of the present invention. Therefore, according to the embodiment of the present invention, it is possible to provide a highly integrated nonvolatile memory element having small power consumption, narrowed performance deviations between memory cells when applied to a nonvolatile memory element, and excellent reliability.

The various non-volatile memory elements disclosed with reference to the drawings attached hereto may be implemented as a single memory element or may be implemented may be implemented in the form of a system on chip SOC together with other heterogeneous elements, for example, a logic processor, an image sensor, and RF elements in a wafer chip. In addition, a wafer chip on which a non-volatile memory element is formed and another wafer chip on which a heterogeneous element is formed may be mounted in a single chip type via a bonding process using an adhesive, soldering, or wafer bonding technique.

Figure 7:
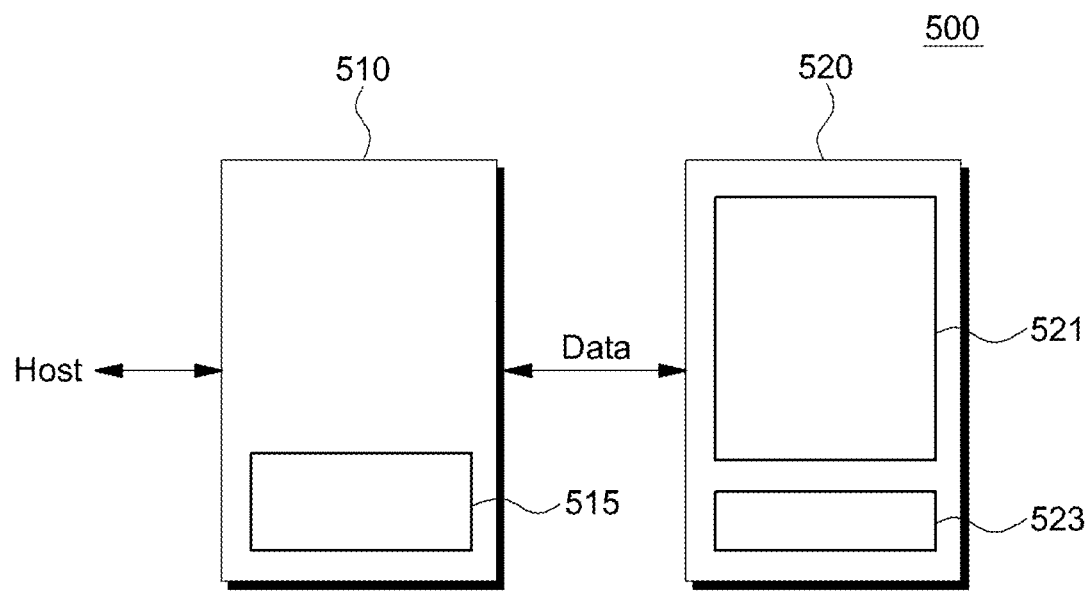
FIG. 7 shows a block diagram illustrating a memory system in accordance with one embodiment of the present invention.

FIG. 7 is a block diagram illustrating a memory system 500 in accordance with one embodiment of the present invention.

Referring to FIG. 7, the memory system 500 includes a memory controller 510 and a non-volatile memory element 520. The memory controller 510 may perform an error correction code for the non-volatile memory element 520. The memory controller 510 may control the nonvolatile memory element 520 with reference to an instruction and an address from the outside.

When the memory controller 510 receives the write request from the host, the memory controller 510 may perform error correction encoding on the data for which the write operation is requested. In addition, the memory controller 510 may control the non-volatile memory element 520 to program the encoded data into a memory area corresponding to the provided address. In addition, the memory controller 510 may perform error correction decoding on the data output from the nonvolatile memory 520 during a read operation. The error included in the output data may be corrected by the error correction decoding. The memory controller 510 may include an error correction block 515 to perform the detection and correction of the error.

The non-volatile memory element 520 may include a memory cell array 521 and a page buffer 523. The memory cell array 521 may comprise a single level memory cell or an array of multilevel memory of two or more bits cells. When the memory controller 510 receives the program command, the dispersion of the fringing field is limited according to the above-described embodiments, so that the program charge accumulated in the area between the memory cells of the charge trap storage layer may be reduced or suppressed.

Figure 8:
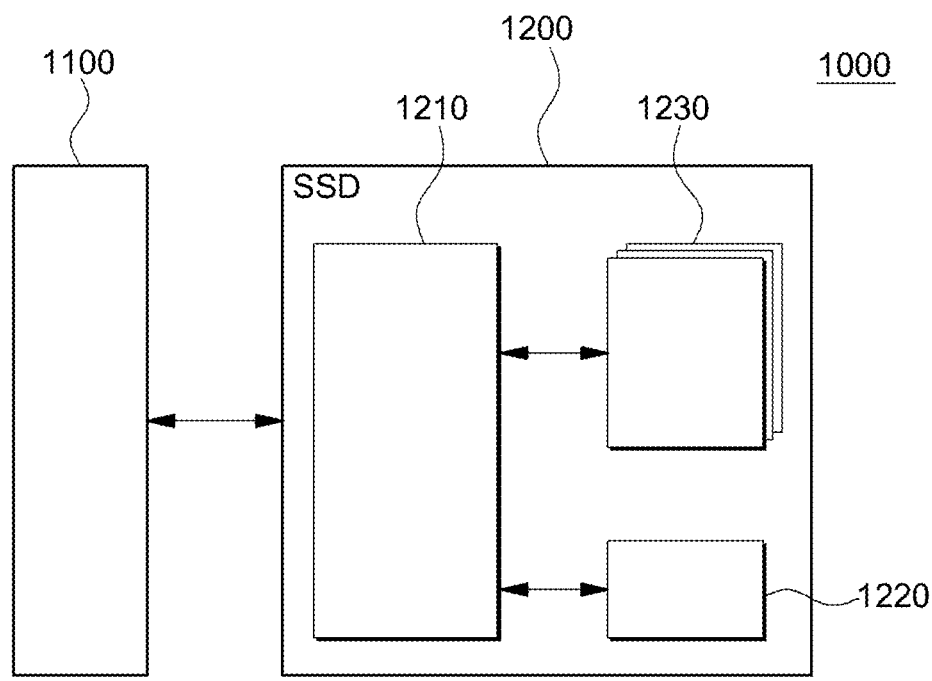
FIG. 8 shows a block diagram illustrating a storage element including a solid-state disk (SSD) according to one embodiment of the present invention.

FIG. 8 is a block diagram illustrating a storage element 1000 including a solid-state disk SSD according to one embodiment of the present invention.

Referring to FIG. 8, a storage element 1000 includes a host 1100 and an SSD 1200. The SSD 1200 may include an SSD controller 1210, a buffer memory 1220, and a non-volatile memory element 1230. The SSD controller 1210 provides electrical and physical connections between the host 1100 and the SSD 1200. In one embodiment, the SSD controller 1210 provides interfacing with the SSD 1200 in response to the bus format of the host 1100. In addition, the SSD controller 1210 may decode the instruction provided from the host 1100 and access the non-volatile memory element 1230 according to the decoded result. USB (Universal Serial Bus), SCSI (Small Computer System Interface), PCI express, ATA (Advanced Technology Attachment), PATA (Parallel ATA), SATA (Serial ATA), and SAS (Serial Attached SCSI) and the like may be included as non-limiting examples of the bus format of the host 1100.

Write data provided from the host 1100 or data read from the nonvolatile memory element 1230 may be temporarily stored in the buffer memory 1220. When data existing in the nonvolatile memory element 1230 is cached at the time of the read request of the host 1100, the buffer memory 1220 is provided with a cache function to directly provide the cached data to the host 1100. In general, the data transfer rate based on the host 1100 bus format (e.g., SATA or SAS) may be faster than the transfer rate of the memory channel of the SSD 1200. In this case, a large-capacity buffer memory 1220 is provided to minimize the performance degradation caused by the speed difference. The buffer memory 1220 for this purpose may be a synchronous in order to provide sufficient buffering, but is not limited to it.

The nonvolatile memory element 1230 may be provided as a storage medium of the SSD 1200. For example, the non-volatile memory element 1230 may include a memory cell having a resistive switching layer according to the above-described embodiment. In another example, a memory system in which a NOR flash memory, a phase change memory, a magnetic memory, a resistive memory, a ferroelectrics memory, or the heterogeneous memory elements selected from the above-mentioned memories as the non-volatile memory element 1230 are mixed may be applied.

Figure 9:
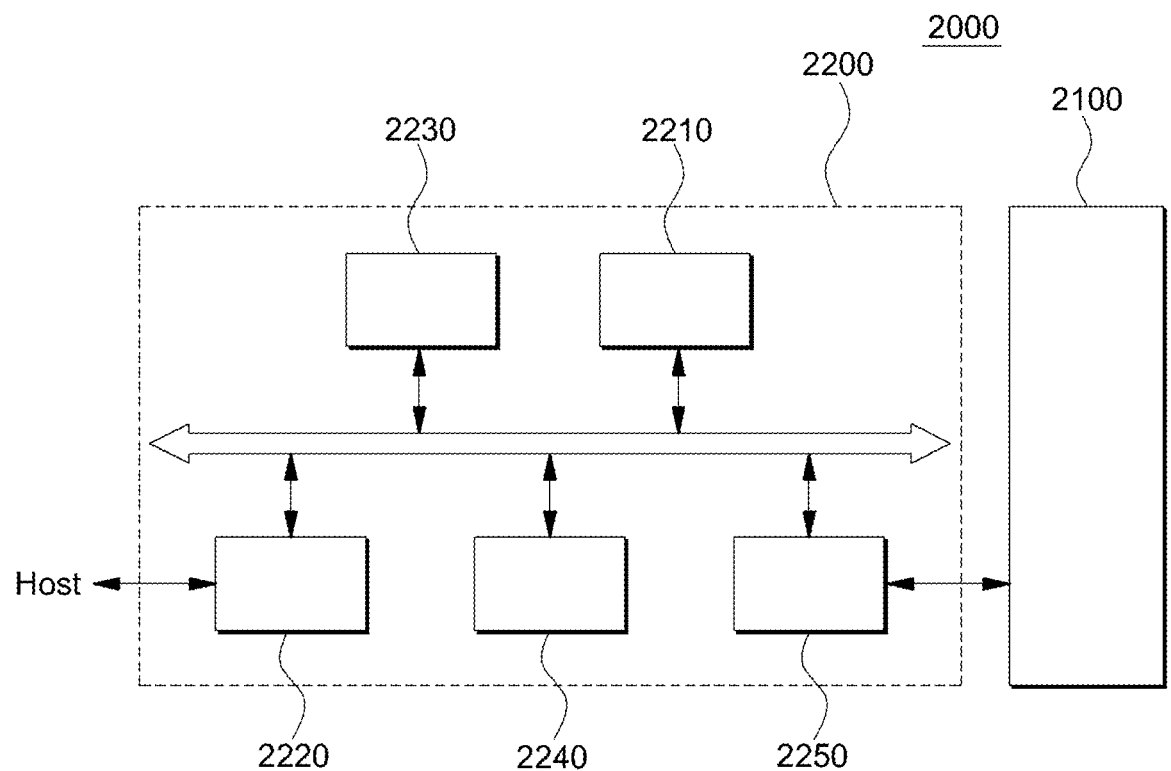
FIG. 9 shows a block diagram illustrating a memory system in accordance with another embodiment of the present invention.

FIG. 9 is a block diagram illustrating a memory system 2000 in accordance with another embodiment of the present invention.

Referring FIG. 9, a memory system 2000 according to the present invention may include a memory controller 2200 and a non-volatile memory element 2100. The non-volatile memory element 2100 may include the variable resistor disclosed with reference to FIG. 1-FIG. 6. The memory controller 2200 may be configured to control the non-volatile memory element 2100. The SRAM 2230 may be used as an operation memory of the CPU 2210. The host interface 2220 may implement a data exchange protocol of the host connected to the memory system 2000. The error correction circuit 2240 provided in the memory controller 2200 may detect and correct errors contained in data read from the nonvolatile memory 2100. The memory interface 2260 may interface with the memory element 2100 of the present invention. The CPU 2210 may perform all control operations for data exchange of the memory controller 2200. The memory system 2000 according to the present invention may further include a ROM (not shown) for storing code data for interfacing with a host.

The memory controller 2100 may be configured to communicate with external circuitry (e.g., a host) through various kinds of interface protocols such as USB, MMC, PCI-E, SAS, SATA, PATA, SCSI, ESDI. The memory system 2000 according to the present invention may be applied to a computer, a portable computer, an UMPC (Ultra Mobile PC), a workstation, a netbook, a PDA, a portable computer, a tablet, a wireless phone, a mobile phone, a smart phone, a digital camera, a digital audio recorder, a digital audio player, a digital picture recorder, a digital picture player, a digital video recorder, a digital video player, an element capable of transmitting and receiving information in a wireless environment, and a home network.

Figure 10:
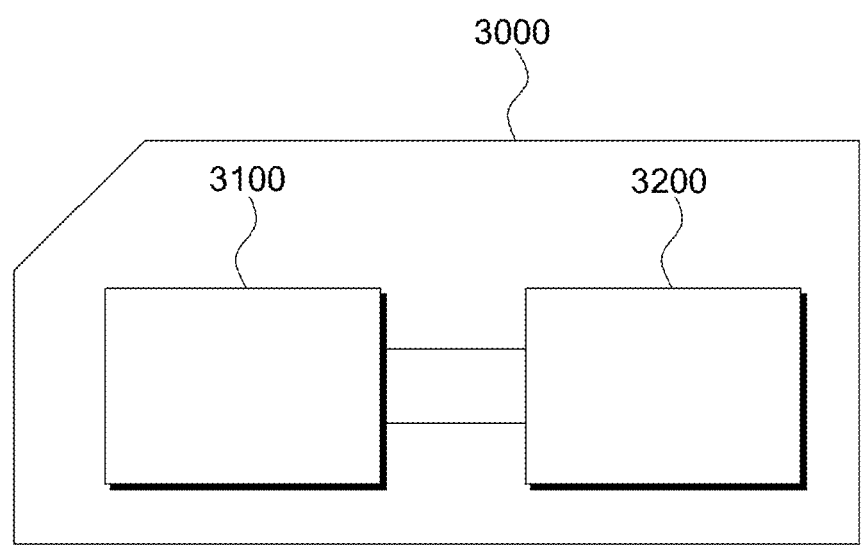
FIG. 10 shows a block diagram illustrating a data storage element according to another embodiment of the present invention.

FIG. 10 is a block diagram illustrating a data storage element 3000 according to another embodiment of the present invention.

Referring to FIG. 10, the data storage element 3000 according to the present invention may include a non-volatile memory 3100 and a memory controller 3200. The memory controller 3200 may control the non-volatile memory 3100 based on control signals received from external circuitry of the data storage element 3000. The three-dimensional memory array structure of the nonvolatile memory 3100 may be, for example, a channel stacking structure or a vertical structure, and the structure is only illustrative, and the present invention is not limited thereto.

The data storage element 3000 of the present invention may constitute a memory card element, an SSD element, a multimedia card element, an SD card, a memory stick element, a hard disk drive element, a hybrid drive element, or a universal serial bus flash element. For example, the data storage element 3000 of the present invention may be a memory card that meets standards or specifications for using electronic elements such as a digital camera, or personal computers.

Figure 11:
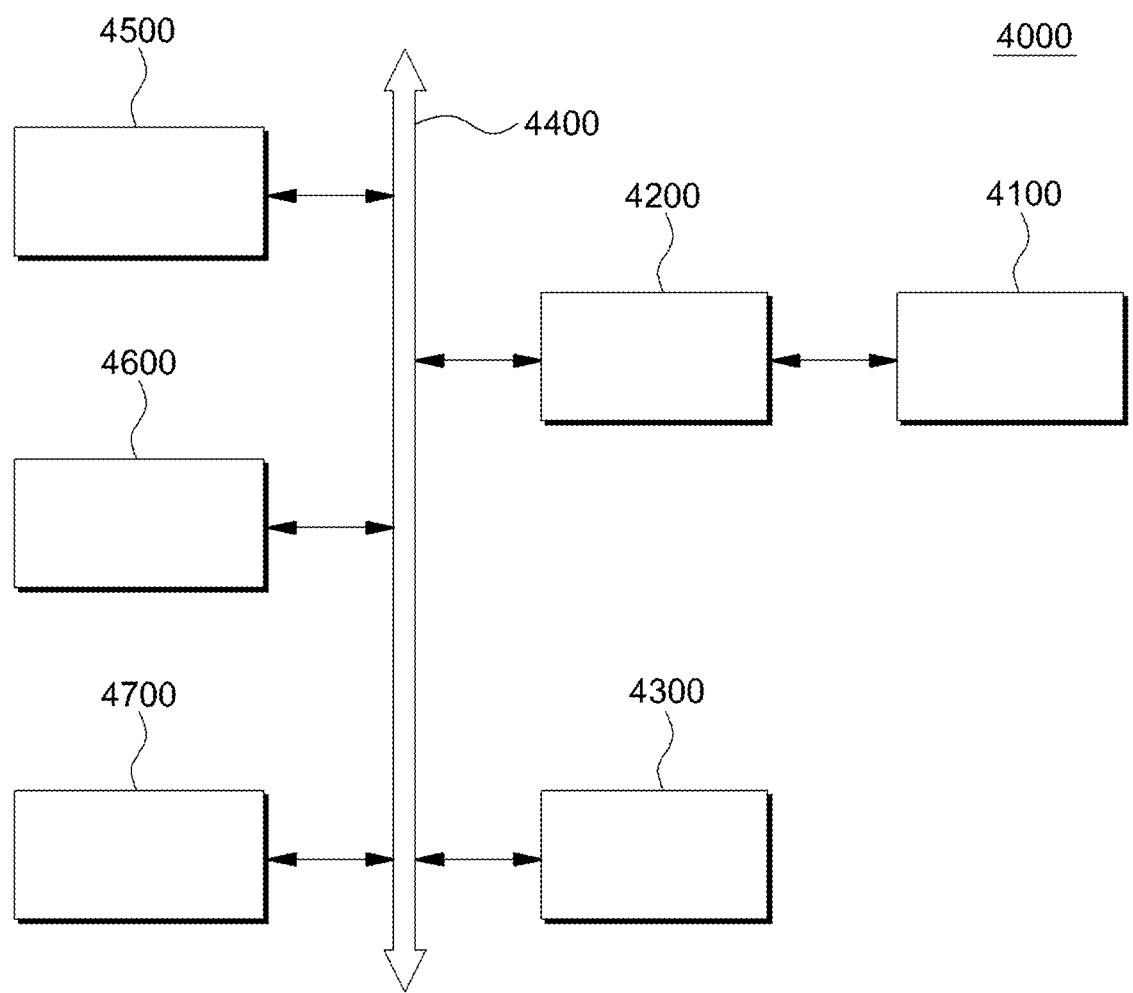
FIG. 11 shows a block diagram illustrating a non-volatile memory element and a computing system including the non-volatile memory element according to an embodiment of the present invention.

FIG. 11 is a block diagram illustrating a non-volatile memory element 4100 and a computing system 4000 including the same according to an embodiment of the present invention.

Referring to FIG. 11, a computing system 4000 in accordance with the present invention may include a non-volatile memory element 4100 electrically coupled to a bus 4400, a memory controller 4200, a modem 4300 such as a baseband chipset, a microprocessor 4500, and a user interface 4600.

The non-volatile memory element 4100 shown in FIG. 11 is a non-volatile memory element as described in the foregoing paragraphs. The computing system 4000 according to the present invention may be a mobile element. In this case, a battery 470 may be further provided for supplying the operating voltage of the computing system 4000. Although not shown, in a computing system according to the invention, an application chipset, a camera image processor (CIS), or a mobile DRAM may be further provided. The memory controller 4200 and the nonvolatile memory element 4100 may constitute, for example, a solid-state drive/disk (SSD) using a nonvolatile memory element for storing data.

The non-volatile memory element and/or memory controller according to the present invention may be implemented using various types of packages. For example, the non-volatile memory element and/or the memory controller according to the present invention may be implemented by using the packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SiP), Multi-Chip Package (MCP), Wafer-level Fabricated Package (WFP), or Wafer-Level Processed Stack Package (WSP).

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A variable resistor comprising,
   a first electrode;
   a second electrode; and
   a resistive switching layer disposed between the first electrode and the second electrode, wherein the resistive switching layer includes a Brown-Millerite structure having a crystal plane oriented in an inclined orientation across the first electrode and the second electrode as an initial structure, the Brown-Millerite structure oriented in a direction other than Miller index 100,
   wherein the crystal plane comprises an octahedral structure layer, wherein the octahedral structure layer in the Brown-Millerite structure is inclined with respect to the first electrode and the second electrode, and wherein the octahedral structure layer in the Brown-Millerite structure connects the first electrode and the second electrode.

2. The variable resistor of claim 1, wherein the crystal plane is preferentially oriented in a direction of the Miller index 111.

3. The variable resistor of claim 1, wherein the Brown-Millerite structure includes at least two adjacent octahedron slab layers which are in contact with the first electrode and the second electrode and intersects with the first electrode and the second electrode.

4. The variable resistor of claim 1, wherein in the resistive switching layer, a reversible conductive path is formed through a topotactic phase transition from at least a portion of the Brown-Millerite structure to a perovskite crystal structure by application of an external power signal flowing through the first and second electrodes, electrodes.

5. The variable resistor of claim 1, wherein the resistive switching layer comprises $(Ba, Sr, Ca)_2(Fe, Co)_2O_5$, $Ca_2Al_2O_5$, or $Ca_2SiO_4$.

6. The variable resistor of claim 1, wherein the thickness of the resistive switching layer is in the range of 20 nm to 500 nm.

7. The variable resistor of claim 1, wherein any one of the first electrode and the second electrode includes a conductive metal oxide for supplying oxygen ions to the variable resistance layer.

8. The variable resistor of claim 7, wherein the conductive metal oxide has a perovskite crystal structure.

9. The variable resistor of claim 7, wherein the conductive metal oxide is preferentially oriented in a direction of Miller index 111.

10. The variable resistor of claim 1, wherein any one of the first electrode and the second electrode includes an epitaxial base layer of a perovskite crystal structure.

11. A non-volatile memory device comprising,
    a first conductive line;
    a second conductive line; and
    an array of memory cells between the first conductive line and the second conductive line,
    wherein the memory cell comprising:
    a first electrode coupled to the first conductive line;
    a second electrode coupled to the second conductive line; and
    a resistive switching layer disposed between the first electrode and the second electrode and having a Brown-Millerite structure as an initial structure, and crystallized in an inclined orientation across the first electrode and the second electrode, the Brown-Millerite structure oriented in a direction other than Miller index 100, and
    wherein the Brown-Millerite structure has a crystal plane, wherein the crystal plane comprising an octahedral structure layer, wherein the octahedral structure layer in the Brown-Millerite structure is inclined with respect to the first electrode and the second electrode, and wherein the octahedral structure layer in the Brown-Millerite structure connects the first electrode and the second electrode.

12. The non-volatile memory device of claim 11, wherein a reversible conductive path is formed through topotactic phase transitions from in at least a part of the Brown-Millerite structure to a perovskite crystal structure after selecting the first conductive line and the second conductive line, and applying an electric foaming signal flowing through the first electrode and the second electrode.

13. The non-volatile memory device of claim 11, wherein the resistive switching layer comprises $(Ba, Sr, Ca)_2(Fe, Co)_2O_5$, $Ca_2Al_2O_5$, or $Ca_2SiO_4$.

14. The non-volatile memory device of claim 11, wherein the thickness of the resistive switching layer is in the range of 20 nm to 500 nm.

15. The non-volatile memory device of claim 11, wherein any one of the first electrode and the second electrode includes a conductive metal oxide for supplying oxygen ions to the variable resistance layer.

16. The non-volatile memory device of claim 15, wherein the conductive metal oxide has a perovskite crystal structure.

17. The non-volatile memory device of claim 15, wherein the conductive metal oxide is preferentially oriented in a direction of Miller index 111.

18. The non-volatile memory device of claim 11, wherein any one of the first electrode and the second electrode includes an epitaxial base layer of a perovskite crystal structure.

19. The variable resistor of claim 1, wherein, in the initial structure, the resistive switching layer further comprises a tetrahedral structure layer contacting the octahedral structure layer, wherein the tetrahedral structure layer in the Brown-Millerite structure is inclined with respect to the first electrode and the second electrode, and the tetrahedral structure layer in the Brown-Millerite structure connects the first electrode and the second electrode.

20. The non-volatile memory device of claim 11, wherein, in the initial structure, the resistive switching layer further comprises a tetrahedral structure layer contacting the octahedral structure layer, wherein the tetrahedral structure layer in the Brown-Millerite structure is inclined with respect to the first electrode and the second electrode, and the tetrahedral structure layer in the Brown-Millerite structure connects the first electrode and the second electrode.

* * * * *